US010355641B2

United States Patent
Kishi et al.

(10) Patent No.: US 10,355,641 B2
(45) Date of Patent: Jul. 16, 2019

(54) CRYSTAL OSCILLATOR DEVICE AND METHOD OF MEASURING CRYSTAL OSCILLATOR CHARACTERISTIC

(71) Applicant: FUJITSU LIMITED, Kawasaki-shi, Kanagawa (JP)

(72) Inventors: Masakazu Kishi, Kawasaki (JP); Hajime Kubota, Kawasaki (JP); Masayuki Itoh, Kawasaki (JP); Yoshinori Mesaki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 128 days.

(21) Appl. No.: 15/602,202

(22) Filed: May 23, 2017

(65) Prior Publication Data
US 2017/0359022 A1    Dec. 14, 2017

(30) Foreign Application Priority Data

Jun. 10, 2016    (JP) .................................. 2016-116464

(51) Int. Cl.
*G01H 9/00*    (2006.01)
*H03B 1/02*    (2006.01)
(Continued)

(52) U.S. Cl.
CPC ................. *H03B 1/02* (2013.01); *G01H 9/00* (2013.01); *H03B 5/32* (2013.01); *H03B 5/364* (2013.01);
(Continued)

(58) Field of Classification Search
CPC . H03B 5/32; H03B 5/36; H03B 5/364; H03B 5/06; H03B 2200/0034;
(Continued)

(56) References Cited

U.S. PATENT DOCUMENTS

| 4,144,747 A | 3/1979 | Datwyler, Jr. |
| 4,678,905 A * | 7/1987 | Phillips .................. G01D 5/268 250/227.21 |

(Continued)

FOREIGN PATENT DOCUMENTS

| JP | 1-186003 A | 7/1989 |
| JP | 3-220806 A | 9/1991 |

(Continued)

OTHER PUBLICATIONS

U.S. Office Action dated Dec. 20, 2018 for copending U.S. Appl. No. 15/602,173, 11 pages.

(Continued)

*Primary Examiner* — Ryan Johnson
(74) *Attorney, Agent, or Firm* — Fujitsu Patent Center

(57) ABSTRACT

A crystal oscillator device is disclosed. The crystal oscillator device includes: a crystal piece provided in a casing; a pair of excitation electrodes provided on the crystal piece; a light emitting element configured to emit light that is to be reflected by one of the excitation electrodes to generate reflected light; a light receiving element configured to receive the reflected light; and an alarm generator configured to generate an alarm based on a signal upon an index value being less than or equal to a reference value, the signal being generated in the light receiving element, the index value representing an oscillation level of the crystal piece in an oscillating state.

14 Claims, 22 Drawing Sheets

(51) Int. Cl.
*H03B 5/32* (2006.01)
*H03G 3/20* (2006.01)
*H03B 5/36* (2006.01)
*H03G 3/30* (2006.01)

(52) U.S. Cl.
CPC ....... *H03G 3/20* (2013.01); *H03B 2200/0034* (2013.01); *H03B 2200/0046* (2013.01); *H03B 2200/0066* (2013.01); *H03G 3/30* (2013.01)

(58) Field of Classification Search
CPC ..... H03B 2200/0046; H03B 1/02; H03L 3/00; H03L 5/00; G01H 11/08; G01H 9/00
See application file for complete search history.

(56) References Cited

U.S. PATENT DOCUMENTS

| | | | |
|---|---|---|---|
| 5,572,322 | A | 11/1996 | Noda |
| 5,654,678 | A | 8/1997 | Miyazaki |
| 7,859,355 | B2 | 12/2010 | Brennan et al. |
| 7,893,784 | B2 | 2/2011 | Hirama |
| 8,456,243 | B2 | 6/2013 | Aleman et al. |
| 8,564,378 | B2 | 10/2013 | Takahashi |
| 8,928,419 | B2 | 3/2015 | Ishii et al. |
| 9,024,695 | B2 | 5/2015 | Kishi |
| 9,520,830 | B2 | 12/2016 | Sato et al. |
| 2007/0040470 | A1 | 2/2007 | Watanabe |
| 2008/0279250 | A1 | 11/2008 | Kamei |
| 2011/0156823 | A1 | 6/2011 | Koyama et al. |
| 2012/0068776 | A1 | 3/2012 | Asamura et al. |
| 2012/0326794 | A1 | 12/2012 | Kammula |
| 2016/0218671 | A1 | 7/2016 | Jun et al. |
| 2017/0359021 | A1 | 12/2017 | Kishi et al. |
| 2017/0359022 | A1 | 12/2017 | Kishi et al. |
| 2017/0359023 | A1 | 12/2017 | Kishi et al. |
| 2017/0359025 | A1 | 12/2017 | Kishi et al. |
| 2017/0359026 | A1 | 12/2017 | Kishi et al. |
| 2017/0359044 | A1 | 12/2017 | Kishi et al. |
| 2018/0054163 | A1 | 2/2018 | Chen et al. |

FOREIGN PATENT DOCUMENTS

| | | |
|---|---|---|
| JP | 6-177645 A | 6/1994 |
| JP | 08-015122 | 1/1996 |
| JP | 08-327398 | 12/1996 |
| JP | 2004-198126 A | 7/2004 |
| JP | 2008-139256 A | 6/2008 |
| JP | 2010-232974 A | 10/2010 |
| JP | 2011-135342 A | 7/2011 |
| JP | 2012-070193 A | 4/2012 |
| JP | 2013-106052 A | 5/2013 |
| WO | 2012/042889 A1 | 4/2012 |

OTHER PUBLICATIONS

U.S. Office Action dated Dec. 4, 2018 for copending U.S. Appl. No. 15/498,679, 23 pages.
U.S. Office Action dated Jan. 8, 2019 or copending U.S. Appl. No. 15/602,158, 13 pages.
U.S. Office Action dated Feb. 12, 2019 for copending U.S. Appl. No. 15/581,908, 10 pages.
U.S. Office Action dated Feb. 1, 2019 for copending U.S. Appl. No. 15/581,908, 10 pages.
U.S. Office Action dated Jan. 10, 2019 for copending U.S. Appl. No. 15/581,908, 12 pages.
U.S. Office Action dated Dec. 10, 2018 for copending U.S. Appl. No. 15/581,908, 12 pages.
U.S. Office Action dated Jan. 22, 2019 for copending U.S. Appl. No. 15/585,249, 13 pages.
Rowe, Martin, "Check the clock oscillators", May 1, 2007, retrieved from http://www.edn.com/Pdf/ViewPdf?contentItemId=4381286 on Dec. 14, 2018, 2 pages.
U.S. Office Action dated Apr. 22, 2019 for copending U.S. Appl. No. 15/498,679, 13 pages.
U.S. Office Action dated Apr. 24, 2019 for copending U.S. Appl. No. 15/602,158, 19 pages.
U.S. Office Action dated Apr. 10, 2019 for copending U.S. Appl. No. 15/602,173, 21 pages.
U.S. Office Action dated Apr. 12, 2019 for copending U.S. Appl. No. 15/585,249, 19 pages.

* cited by examiner

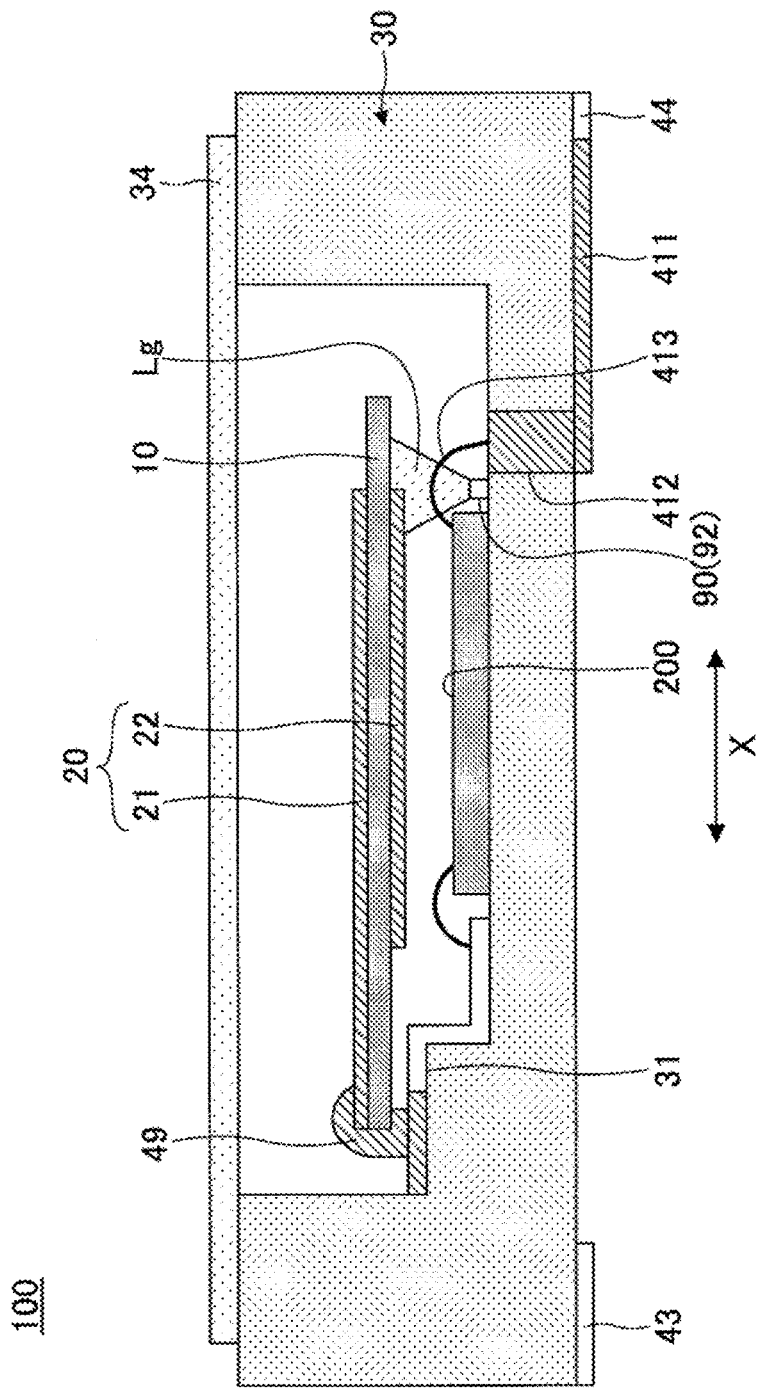

FIG.3
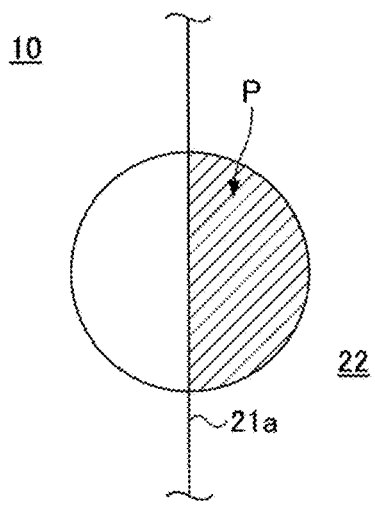
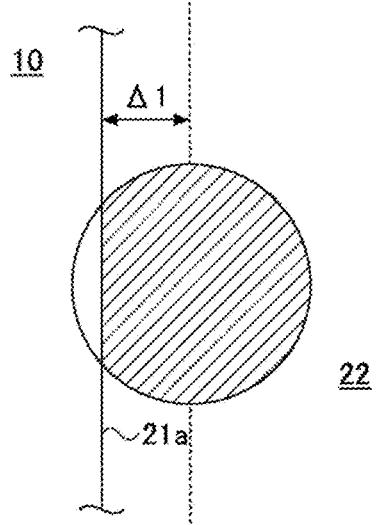
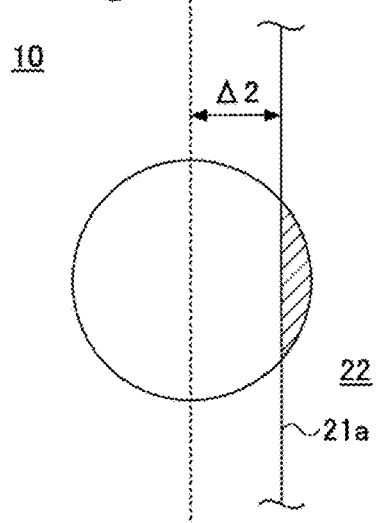

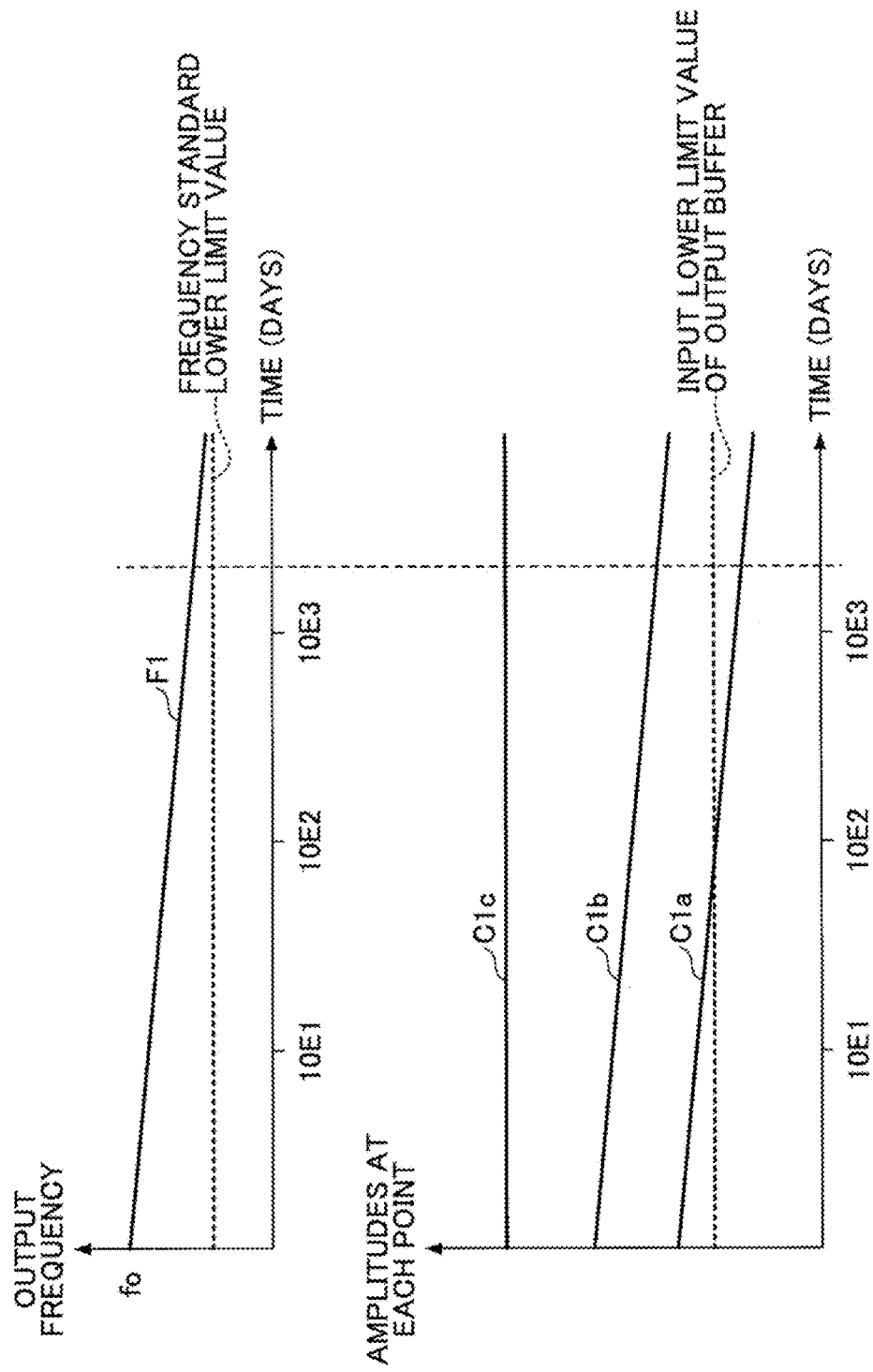

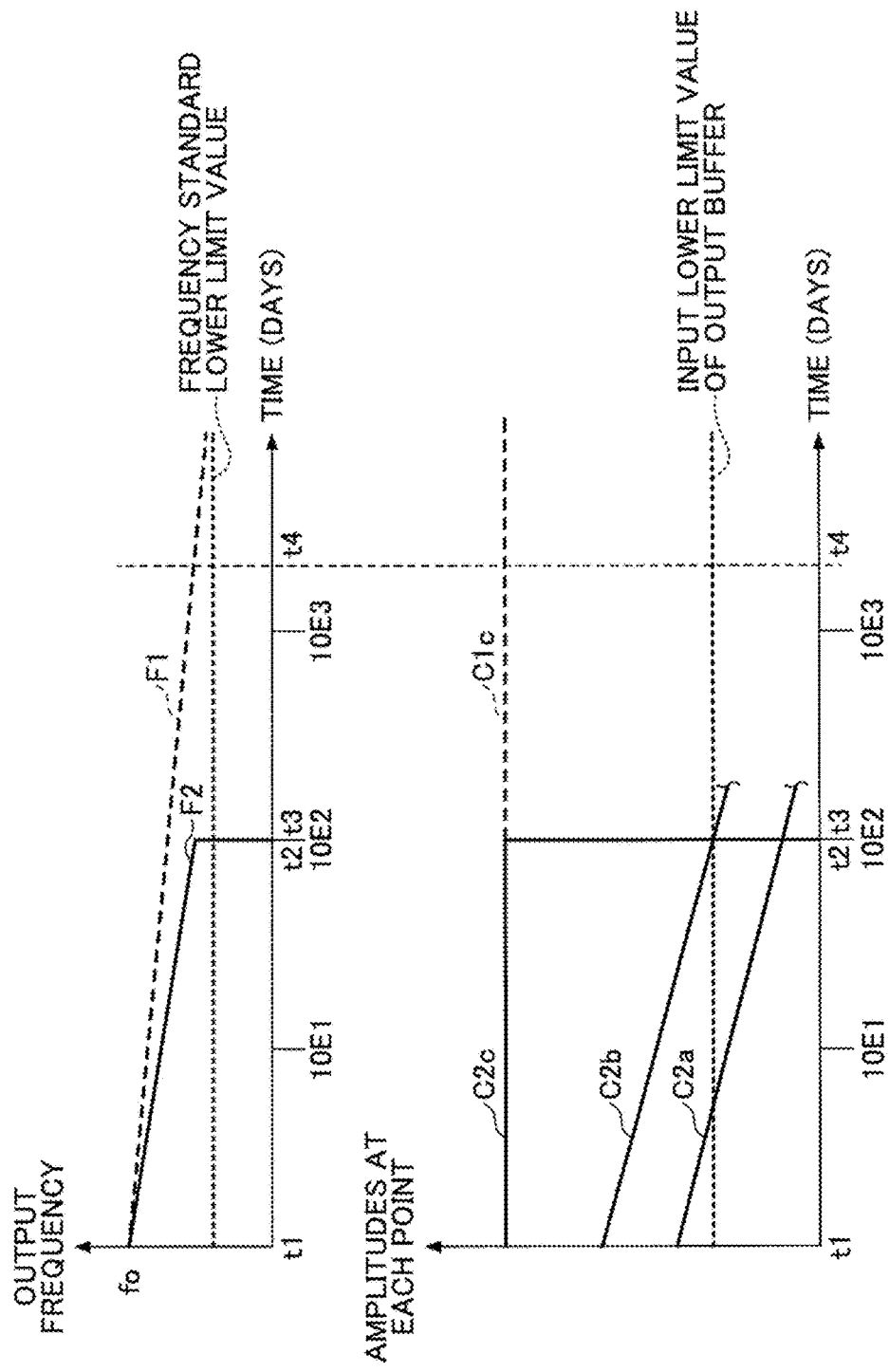

FIG.9A
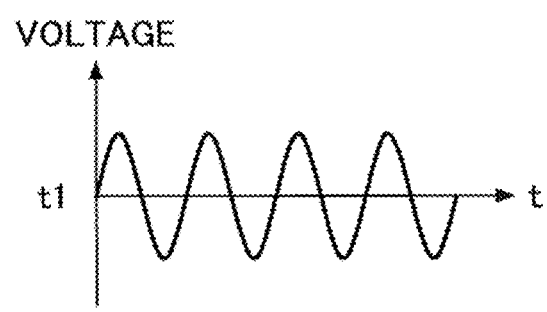
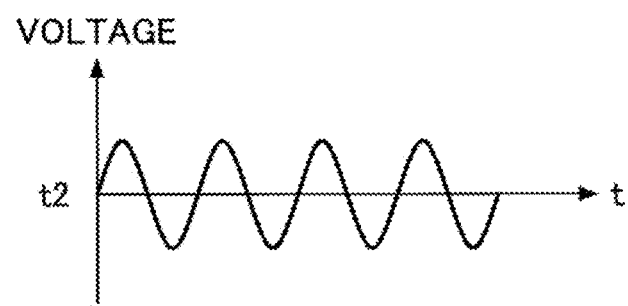
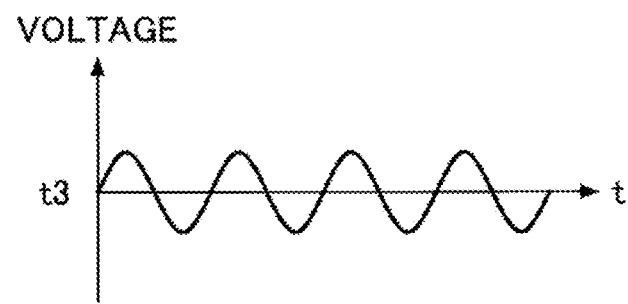

FIG.9C
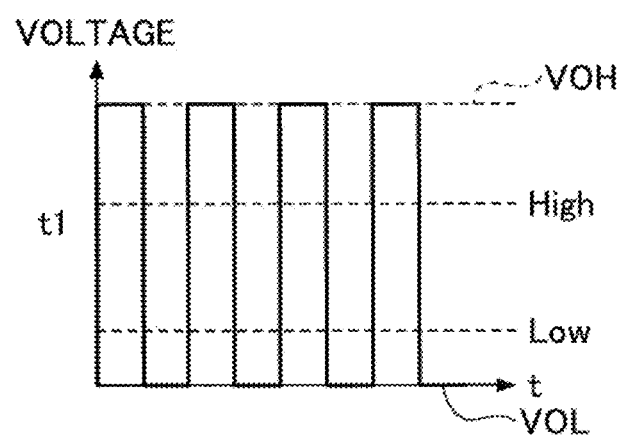
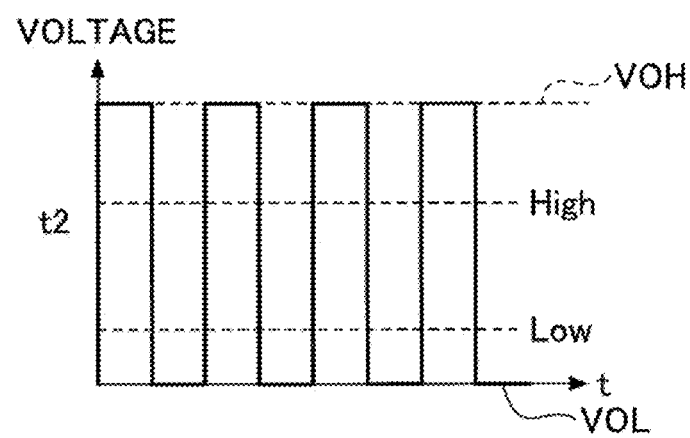
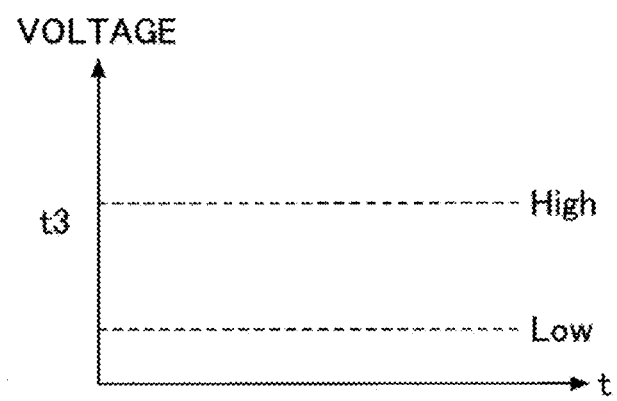

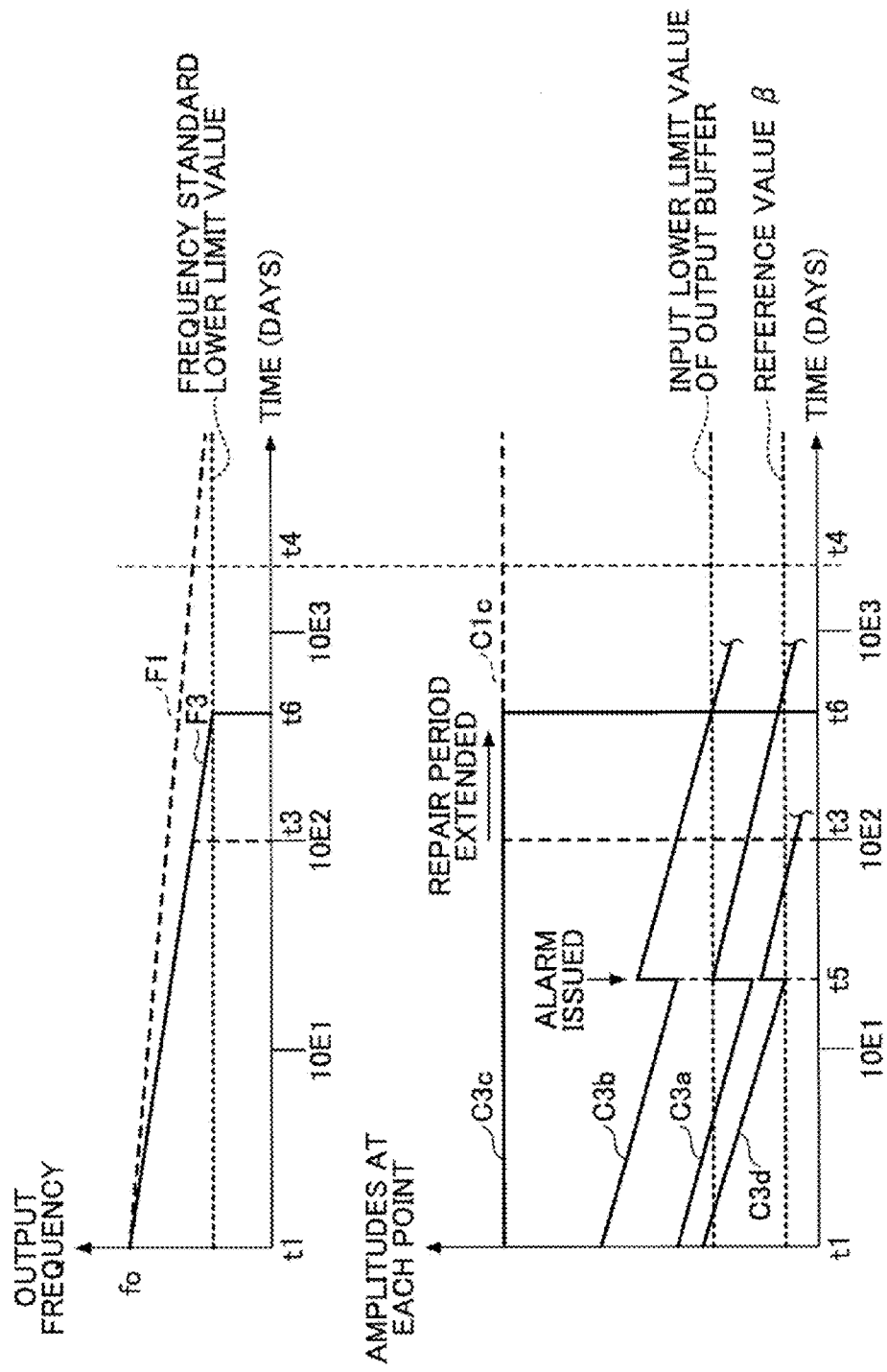

CRYSTAL OSCILLATOR DEVICE AND METHOD OF MEASURING CRYSTAL OSCILLATOR CHARACTERISTIC

CROSS-REFERENCE TO RELATED APPLICATIONS

This present application is based upon and claims the benefit of priority of the prior Japanese Patent Application No. 2016-116464, filed on Jun. 10, 2016, the entire contents of which are incorporated herein by reference.

FIELD

The present disclosure relates to a crystal oscillator device and a method of measuring a characteristic of a crystal oscillator.

BACKGROUND

There is known a technique of measuring a change in a frequency of a crystal oscillator by applying light from a light source to the crystal oscillator and measuring the intensity of the reflected light caused by the vibration of the crystal oscillator.

[Patent Document 1] Japanese Laid-open Patent Publication No. 08-15122
[Patent Document 2] Japanese Laid-open Patent Publication No. 08-327398

However, it is difficult to detect a state of the crystal oscillator before a transition to an output stop state (for example, clock stop) based on such a measurement result of the change in the frequency of the crystal oscillator that is obtained according to the conventional technique as described above. It is noted that the output stop of the crystal oscillator may occur suddenly due to abnormality of the crystal oscillator or the like.

SUMMARY

According to one aspect of the disclosure, a crystal oscillator device is provided, which includes: a crystal piece provided in a crystal piece provided in a casing; a pair of excitation electrodes provided on the crystal piece; a light emitting element configured to emit light that is to be reflected by one of the excitation electrodes to generate reflected light; a light receiving element configured to receive the reflected light; and an alarm generator configured to generate an alarm based on a signal upon an index value being less than or equal to a reference value, the signal being generated in the light receiving element, the index value representing an oscillation level of the crystal piece in an oscillating state.

The object and advantages of the embodiment will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 1B is a cross-sectional view along a line B-B in FIG. 1A.
FIG. 3 is an explanatory diagram of the principle of characteristic detection of a crystal oscillator.
FIG. 7 is an explanatory diagram of characteristics in a case where the crystal oscillator is a normal product.
FIG. 8 is an explanatory diagram of an output stop event of the crystal oscillator due to abnormality.
FIG. 9A is a diagram illustrating a time-series waveform of a signal appearing at a point A in the case of an abnormal product.
FIG. 9C is a diagram illustrating a time-series waveform of a signal appearing at a point C in the case of an abnormal product.
FIG. 10 is a diagram explaining an example of an operation according to the first embodiment.

DESCRIPTION OF EMBODIMENTS

In the following, embodiments are described in detail with reference to appended drawings.

First Embodiment

Figure 1A:
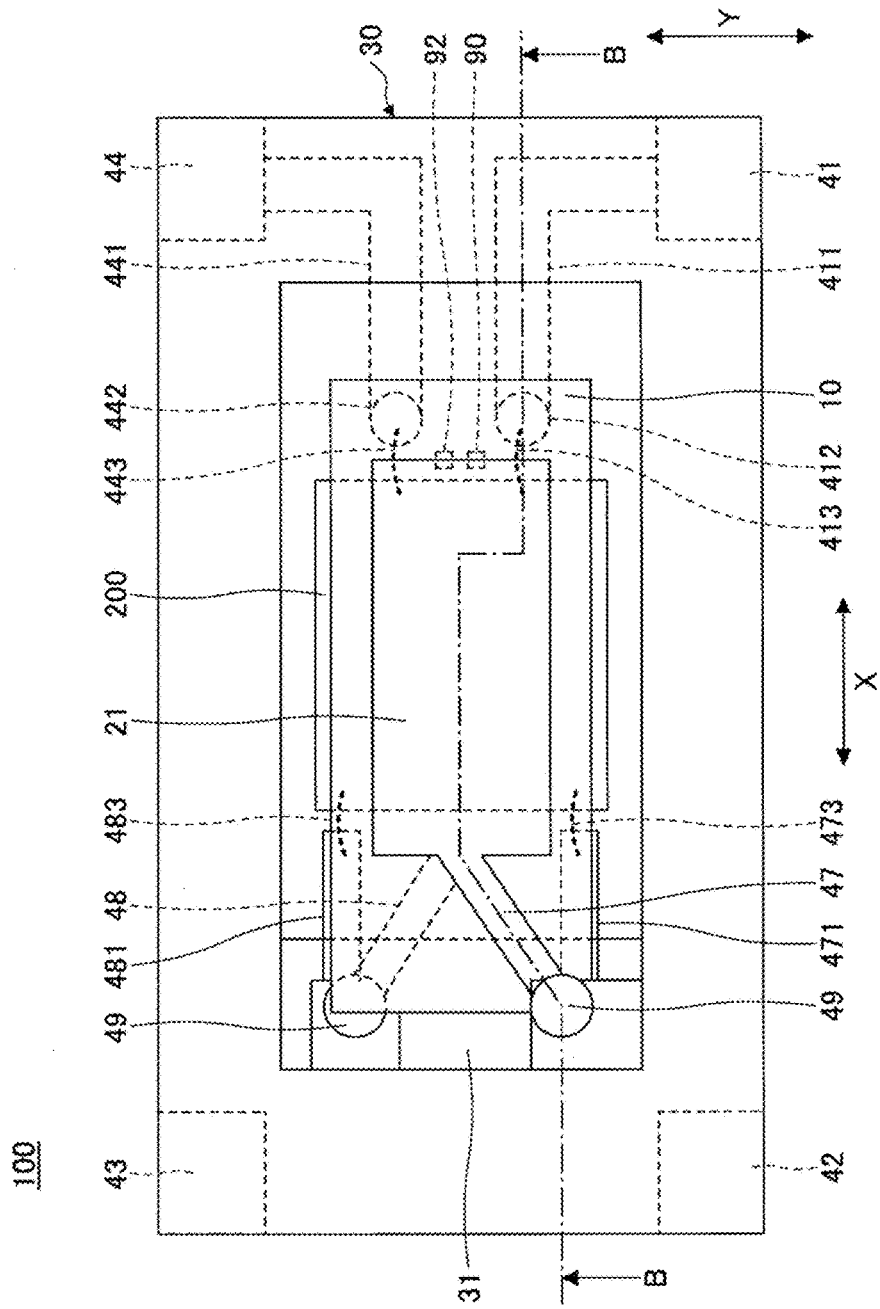
FIG. 1A is a top view schematically illustrating a configuration of a crystal oscillator according to a first embodiment.

FIG. 1A is a top view schematically illustrating a configuration of a crystal oscillator 100 according to a first embodiment, and FIG. 1B is a cross-sectional view along a line B-B in FIG. 1A. In FIG. 1A, a lid of a casing 30 is not illustrated so that an inside can be seen, and invisible elements (an external electrode 41, etc.) are indicated by broken lines. In FIG. 1B, the light Lg from a light emitting element 90 is schematically illustrated. It is noted that FIGS. 1A and 1B illustrate an IC 200 in addition to the crystal oscillator 100.

Hereinafter, a thickness direction of a crystal piece (crystal blank) 10 (vertical direction in FIG. 1B) is defined as the vertical direction, and the side of the casing 30 having the lid is referred to as "upper side". However, an orientation of the installation of the crystal oscillator 100 is arbitrary. In the following, an "outer surface" refers to a surface exposed to an outside of the casing 30, and an "inner surface" refers to a surface exposed to an inner space of the casing 30. Further, as illustrated in FIG. 1A, an X direction is defined as a direction corresponding to a direction of a main vibration (thickness shear vibration) direction of the crystal oscillator 100. As illustrated in FIG. 1A, Y direction is defined as a direction parallel to the surface of the crystal piece 10 and perpendicular to the main vibration direction of the crystal oscillator 100.

The crystal oscillator 100 includes the crystal piece 10, excitation electrodes 20, the casing 30, external electrodes 41 to 44, the light emitting element 90, and a light receiving element 92. As illustrated in FIGS. 1A and 1B, the crystal oscillator 100 is of a surface mounting type.

The crystal piece 10 may be, for example, an AT-cut artificial quartz crystal substrate. An outer shape of the crystal piece 10 is arbitrary, and in the first embodiment, it is a rectangle, but other shapes may be used. Although the supporting structure of the crystal piece 10 is arbitrary. For example, the crystal piece 10 may be supported by the casing 30 in a cantilever structure. In the example illustrated in FIGS. 1A and 1B, the crystal piece 10 is supported in a cantilever structure on a bank portion 31 of the casing 30. When the crystal oscillator 100 is driven, the crystal piece 10 vibrates in X direction (thickness shear vibration).

The excitation electrodes 20 excite the crystal piece 10. The excitation electrodes 20 include an upper excitation electrode 21 provided on the upper surface of the crystal piece 10 and a lower excitation electrode 22 provided on the lower surface of the crystal piece 10. The excitation electrodes 20 excite the crystal piece 10 by a potential difference between the upper excitation electrode 21 and the lower excitation electrode 22. It is noted that the excitation electrodes 20 may be made of gold, silver, aluminum, or the like.

The excitation electrodes 20 are electrically connected to the IC (Integrated Circuit) 200. The way of electrically connecting the excitation electrodes 20 and the IC 200 is arbitrary. In the example illustrated in FIGS. 1A and 1B, the upper excitation electrode 21 is electrically connected to the IC 200 via a conductive pattern 47 formed on an upper surface of the crystal piece 10, an electrically conductive adhesive 49, a conductive pattern 471 formed on an inner surface of a lower part of the casing 30, and a wire 473. Further, the lower excitation electrode 22 is electrically connected to the IC 200 via a conductive pattern 48 formed on a lower surface of the crystal piece 10, an electrically conductive adhesive 49, and a conductive pattern 481 formed on an inner surface of a lower part of the casing 30, and a wire 483. It is noted that the wires 473 and 483 (the same applies to wires described hereinafter) may be formed by wire bonding. It is noted that the electrically conductive adhesive 49 may be provided on an edge portion of the crystal piece 10 (i.e., the edge portion on the cantilevered side).

The casing 30 accommodates the crystal piece 10. The casing 30 is made of, for example, a ceramic material. In this case, the casing 30 may be, for example, a ceramic package formed by laminating ceramic material layers. The casing 30 includes a lid 34 (see FIG. 1B and the like), and hermetically encloses the crystal piece 10 in an internal space (cavity) thereof. For example, the internal space of the casing 30 under vacuum or filled with dry nitrogen and sealed with the lid 34. It is noted that the lid 34 may be a metal plate or a ceramic plate.

The external electrodes 41 to 44 are provided on the casing 30. In the example illustrated in FIGS. 1A and 1B, the external electrodes 41 to 44 are provided on an outer surface of the lower part of the casing 30. The external electrodes 41 to 44 may be electrically connected to the IC 200. The way of electrically connecting the external electrodes 41 to 44 and the IC 200 is arbitrary. In the example illustrated in FIGS. 1A and 1B, the external electrode 41 is electrically connected to the IC 200 via a conductive pattern 411 formed on the outer surface of the lower part of the casing 30, a via 412 formed in the casing 30, and a wire 413. Similarly, the external electrode 44 is electrically connected to the IC 200 via a conductive pattern 441 formed on the outer surface of the lower part of the casing 30, a via 442 formed in the casing 30, and a wire 443. Although not illustrated, the external electrodes 42, 43 and the IC 200 may also be electrically connected via a conductive pattern or the like in the same manner.

The external electrodes 41 to 44 may be electrically connected to an external device or the like outside of the casing 30. That is, the external electrodes 41 to 44 are electrically connected to the IC 200 and the external device to electrically connect the IC 200 to the external device or the like. In the example illustrated in FIGS. 1A and 1B, the external electrodes 41 and 44 may be used to extract signals from an alarm output terminal 222 and a clock output terminal 220 (see FIG. 5) of the IC 200. Further, in the example illustrated in FIGS. 1A and 1B, the external electrodes 42, 43 may be used for electrically connecting the IC 200 to ground and a power supply (both not illustrated) (wirings are not illustrated).

The light emitting element 90 may be any light source such as a gas laser, a LED (light-emitting diode), or a halogen lamp; however, preferably, in view of mountability, a semiconductor laser is used. The light receiving element 92 may be an image pickup element (for example built in a camera), a photodiode or a photomultiplier tube. The light emitting element 90 and the light receiving element 92 are provided in the crystal oscillator 100 so that the light emitted from the light emitting element 90 and reflected by the excitation electrode 20 is received by the light receiving element 92.

In the example illustrated in FIGS. 1A and 1B, the light emitting element 90 is attached to the inner surface (the surface on the inner side of the casing 30) of the lower part of the casing 30 and has an upward optical axis. The light emitting element 90 is provided at a position where the light emitting element 90 is opposed to an edge portion of the lower excitation electrode 22 in the vertical direction. It is noted that the lower excitation electrode 22 is formed of a material that reflects light. The light receiving element 92 is attached to the inner surface (the surface on the inner side of the casing) of the lower part of the casing 30 side by side with the light emitting element 90 in Y direction. The light receiving element 92 is provided at a position where the light receiving element 92 is capable of receiving the light emitted from the light emitting element 90 and reflected by the lower excitation electrode 22. The light emitting element 90 and the light receiving element 92 are electrically connected to the IC 200, respectively. The way of electrically connecting the light emitting element 90 and the light receiving element 92 to the IC 200 is arbitrary. The electrical connection between the light emitting element 90 and the light receiving element 92 and the IC 200 may be realized by wire bonding or the like, for example.

It is noted that, in the examples illustrated in FIGS. 1A and 1B, the light emitting element 90 is attached to the casing 30 such that light is applied to the lower surface of the crystal piece 10; however, the light emitting element 90 may be attached to the casing 30 such that light is applied to the upper surface (an edge portion of the upper excitation electrode 21 (for example, the lid 34) of the crystal piece 10. In this case, the light receiving element 92 is also provided at a position where the light receiving element 92 is capable of receiving the light emitted from the light emitting element 90 and reflected by the upper excitation electrode 21. Further, in the case where the casing 30 (for example, the lid 34) is formed of a transparent material such as transparent ceramic, the light emitting element 90 and/or the light receiving element 92 may be provided outside the casing 30 (See FIG. 14). In addition, in the example illustrated in FIGS. 1A and 1B, the light emitting element 90 and the light receiving element 92 are provided such that the light emitting element 90 and the light receiving element 92 are adjacent to each other in Y direction, but may be provided such that the light emitting element 90 and the light receiving element 92 are adjacent to each other in other directions.

As described above, the IC 200 is electrically connected to the excitation electrodes 20, the light emitting element 90, and the light receiving element 92 of the crystal oscillator 100. The IC 200 forms an example of a crystal oscillator device together with the crystal oscillator 100. In the example illustrated in FIGS. 1A and 1B, the IC 200 is provided on an inner surface of the lower portion of the casing 30. That is, the IC 200 is provided in the internal space of the casing 30. However, in the modified example, the IC 200 may be provided outside the casing 30. In this case, for example, the excitation electrodes 20, the light emitting element 90, and the light receiving element 92 may be electrically connected to the external electrodes 41 to 44, respectively, and the IC 200 may be electrically connected to the external electrodes 41 to 44.

It is noted that, in the examples illustrated in FIGS. 1A and 1B, the IC 200 may be provided with bumps (terminals) on the bottom surface thereof. In this case, the IC 200 may be electrically connected to the via 412 or the like via the bumps instead of the wire 413 or the like.

Figure 2:
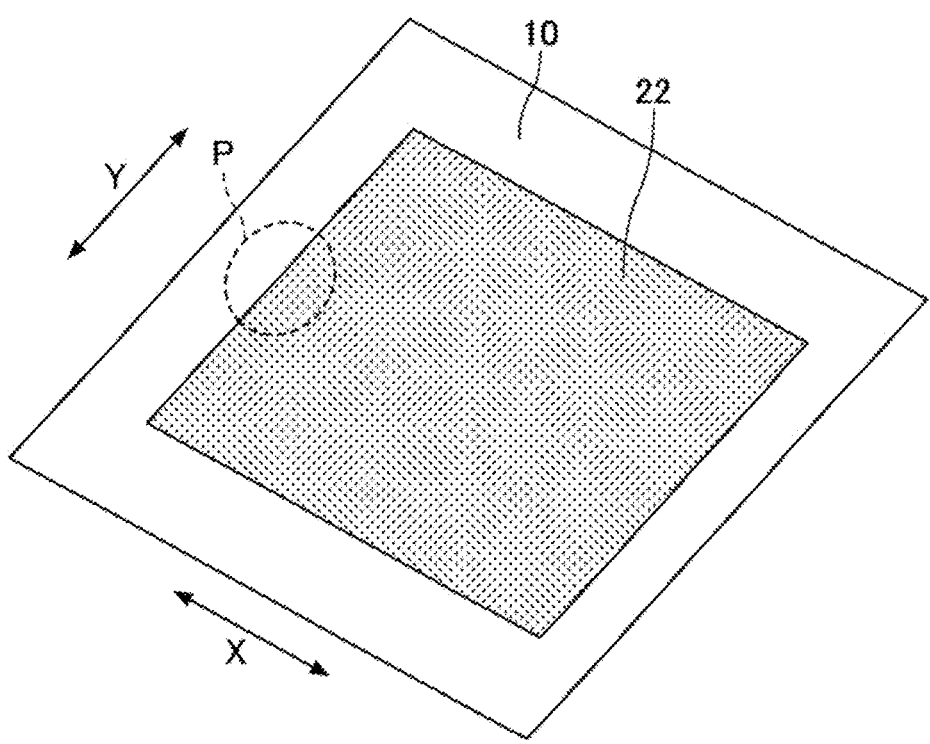
FIG. 2 is a perspective view schematically illustrating an impingement portion of light from a light emitting element.

FIG. 2 is a perspective view schematically illustrating an impingement portion P of the light Lg from the light emitting element 90.

In the oscillating state of the crystal oscillator 100, the light emitting element 90 emits the light Lg toward the lower excitation electrode 22. At this time, as illustrated in FIG. 2, the impingement portion (for example, a spot of the laser light) P includes the edge part of the lower excitation electrode 22 and a part of the crystal piece 10 adjacent to the edge part in X direction. That is, the light emitting element 90 emits the light to simultaneously impinge on the edge portion of the lower excitation electrode 22 and the portion of the crystal piece 10 adjacent to the edge portion in X direction.

When the light Lg thus impinges on the lower excitation electrode 22, the light incident on the lower excitation electrode 22 is reflected and reflected light is generated. On the other hand, the crystal piece 10 transmits the light and does not substantially reflect the light. Therefore, the reflected light is substantially generated only from the lower excitation electrode 22. The reflected light is incident on the light receiving element 92 disposed below the lower excitation electrode 22. That is, the light receiving element 92 receives reflected light from the lower excitation electrode 22.

FIG. 3 is an explanatory diagram of the principle of characteristic detection of the crystal oscillator 100, and (A), (B) and (C) illustrate a relationship between an edge boundary line 21a of the lower excitation electrode 22 and the impingement portion P. In FIG. 3, the portion of the impingement portion P related to the lower excitation electrode 22 is hatched.

Figure 4:
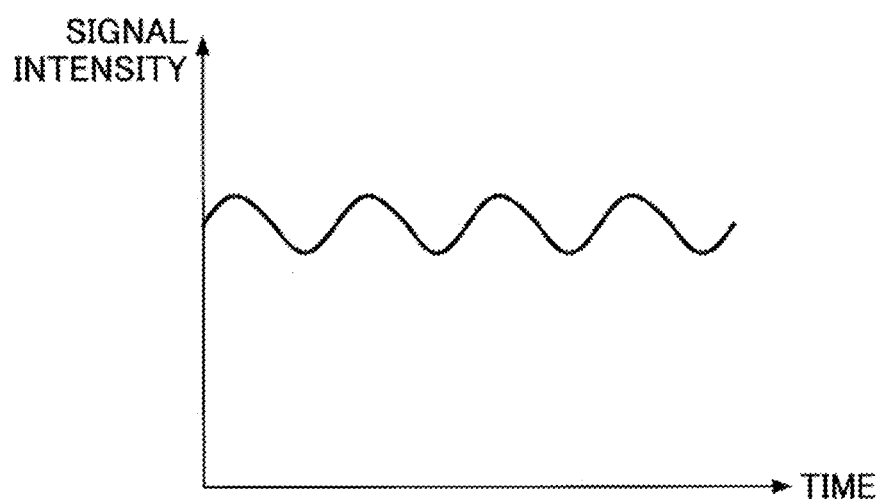
FIG. 4 is an explanatory diagram of a change in intensity of a received light signal.

In the oscillating state of the crystal oscillator 100, a part of the impingement portion P related to the lower excitation electrode 22 changes in area in accordance with the main vibration of the crystal piece 10, as illustrated in FIG. 3. For example, as illustrated in FIG. 3 (B), when the crystal piece 10 is displaced by $\Delta 1$ toward X1 side in X direction as compared with the state illustrated in FIG. 3 (A) due to the main vibration of the crystal piece 10, the area of the part of the impingement portion P related to the lower excitation electrode 22 increases in comparison with the state illustrated in FIG. 3 (A). At this time, the light amount of the reflected light received by the light receiving element 92 increases as compared with the state illustrated in FIG. 3 (A). On the other hand, as illustrated in FIG. 3 (C), when the crystal piece 10 is displaced by $\Delta 2$ toward X2 side in X direction as compared with the state illustrated in FIG. 3 (A) due to the main vibration of the crystal piece 10, the area of the part of the impingement portion P related to the lower excitation electrode 22 decreases as compared with the state illustrated in FIG. 3 (A). At this time, the light amount of the reflected light received by the light receiving element 92 decreases as compared with the state illustrated in FIG. 3 (A). In this manner, the light amount of the reflected light received by the light receiving element 92 changes in accordance with the oscillation of the crystal piece 10. That is, as illustrated in FIG. 4, the light amount (the intensity of the received light signal) of the reflected light received by the light receiving element 92 varies in accordance with the output characteristics of the crystal piece 10. In FIG. 4, the vertical axis represents the signal intensity, the horizontal axis represents the time, and the change in the intensity of the received light signal is illustrated. As illustrated in FIG. 4, the intensity of the received light signal vibrates at a frequency corresponding to the output frequency of the crystal oscillator 100.

When the oscillation level of the crystal piece 10 decreases, the amount of change in the area of the part of the impingement portion P related to the lower excitation electrode 22, which is caused by the oscillation of the crystal piece 10, decreases, so that the amount of change in an amount of the reflected light received by the light receiving element 92 decreases. That is, the amplitude of the light reception signal decreases with the decrease in the oscillation level of the crystal oscillator 100. Therefore, by monitoring the amplitude of the light receiving signal obtained by the light receiving element 92, it is possible to indirectly monitor the oscillation level of the crystal piece 10.

Figure 5:
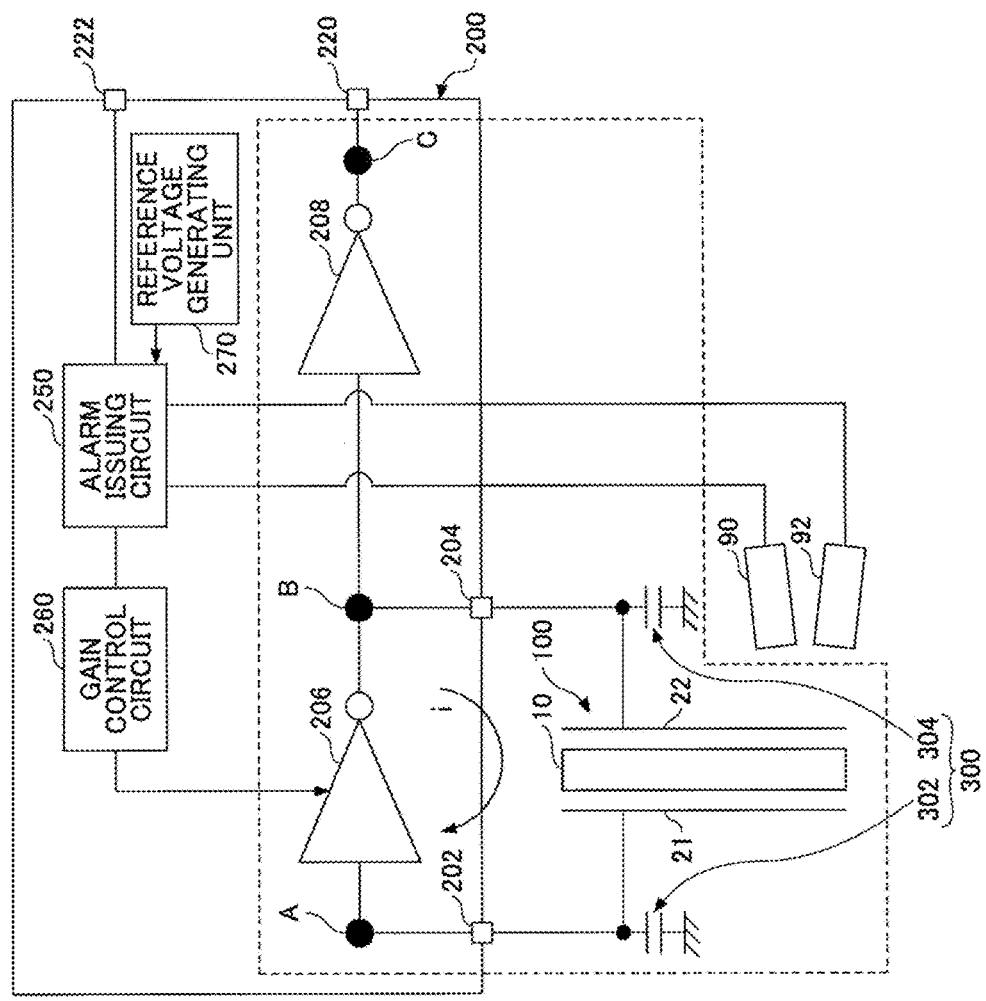
FIG. 5 is a diagram schematically illustrating an example (first embodiment) of a circuit configuration of a crystal oscillator device including a crystal oscillator and an IC.

FIG. 5 is a diagram schematically illustrating an example of a circuit configuration of the crystal oscillator 100 and the IC 200. In FIG. 5, with respect to IC 200, capacitors of terminals, stray capacitance of wiring patterns of the printed circuit board, resistance for limiting the current (see arrow i in FIG. 5) flowing through the crystal oscillator 100, etc., are not illustrated.

In the example illustrated in FIG. 5, the upper excitation electrode 21 and the lower excitation electrode 22 of the crystal oscillator 100 are electrically connected to an input terminal 202 and an output terminal 204 of the IC 200, respectively. However, the lower excitation electrode 22 and the upper excitation electrode 21 of the crystal oscillator 100 may be connected to the input terminal 202 and the output terminal 204 of the IC 200, respectively. The crystal oscillator 100 cooperates with the IC 200 to generate a clock (reference clock) used in an arbitrary device (for example, a communication control device such as a base station device or a relay station device).

A matching capacitor 300 is electrically connected to the crystal oscillator 100. Specifically, a first capacitor 302 is electrically connected between the upper excitation electrode 21 of the crystal oscillator 100 and ground, and a second capacitor 304 is electrically connected between the lower excitation electrode 22 of the crystal oscillator 100 and ground. The matching capacitor 300 is provided for adjustment (matching adjustment) so that the output frequency (initial value) of the crystal oscillator 100 becomes a desired value (designed value) when the total capacitance (load capacitance value) in the overall circuit of the IC 200 including the crystal oscillator 100 is added. It is noted that, in FIG. 5, an area surrounded by a dotted line forms an oscillation circuit.

The IC 200 includes an inverting amplifier 206, an output buffer (buffer circuit) 208, an alarm issuing circuit 250 (an example of an alarm generator), a gain control circuit 260 (an example of a gain control unit), and a reference voltage generating unit 270.

As described above, the inverting amplifier 206 inverts and amplifies the output of the crystal oscillator 100 (the signal input from the upper excitation electrode 21 to the input terminal 202). That is, the signal input from the upper excitation electrode 21 to the input terminal 202 is inverted and amplified by the inverting amplifier 206. The inverted and amplified signal is input to the output buffer 208 and input to the lower excitation electrode 22 via the output terminal 204.

The gain (gain) of the inverting amplifier 206 is variable. It is noted that the inverting amplifier 206 may be of a type that is used for AGC (Automatic Gain Control) (for example, a type that uses a variable resistor or a field effect transistor as a variable resistance element). However, in the first embodiment, control for adjusting the gain of the inverting amplifier 206 (i.e., the automatic gain control) to always keep the output constant is not performed, as described hereinafter. That is, no automatic gain control circuit is provided. As a result, since a circuit configuration for automatic gain control becomes unnecessary, a simple configuration can be realized, and power saving can be achieved.

Figure 6:
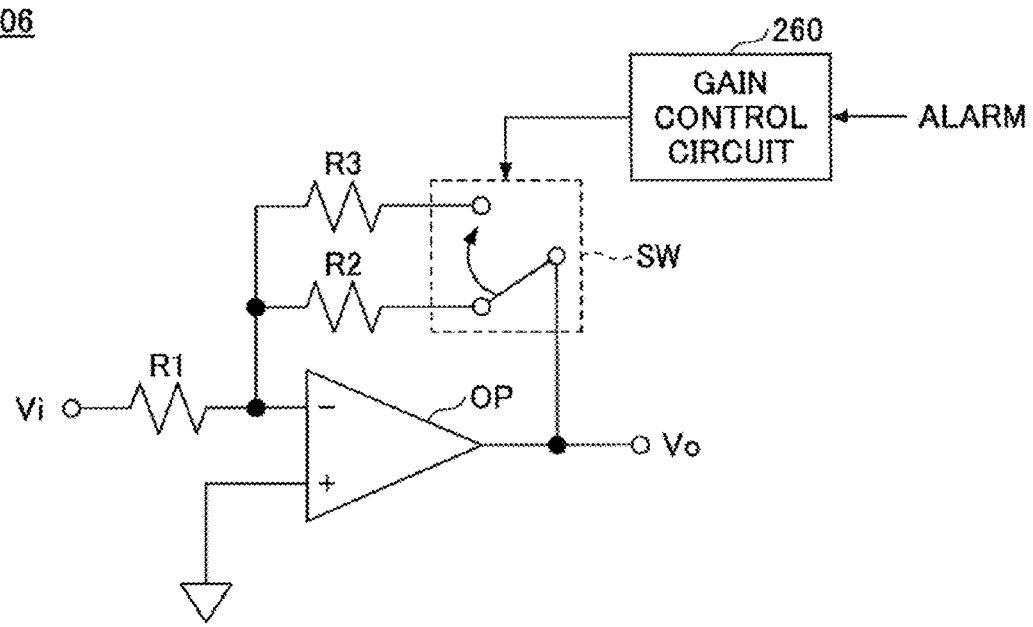
FIG. 6 is a diagram for illustrating an example of an inverting amplifier.

In the first embodiment, as an example, as illustrated in FIG. 6, the inverting amplifier 206 includes an operational amplifier OP, a resistor R2 (an example of a first resistor), and a resistor R3 (an example of a second resistor). The resistors R2 and R3 are provided in parallel on a line which is provided for returning the output of the operational amplifier OP to the inverting terminal. The inverting amplifier 206 further includes a switch SW. The switch SW has a first state in which an inverting terminal of the operational amplifier OP is electrically connected to an output terminal of the operational amplifier OP via the resistor R2, and a second state in which the inverting terminal of the operational amplifier OP is electrically connected to the output terminal of the operational amplifier OP via the resistor R3. The state of the switch SW is controlled by the gain control circuit 260. In the first state, the relationship between the input voltage Vi and the output voltage Vo is Vo=R2/R1×Vi, and R2/R1 is the amplification factor. In the second state, the relationship between the input voltage Vi and the output voltage Vo is Vo=R3/R1×Vi, and R3/R1 is the amplification factor. For example, if R3>R2, since R3/R1>R2/R1, the amplification factor (that is, the gain of the inverting amplifier 206) becomes higher in the second state than in the first state. According to the example illustrated in FIG. 6, it is possible to realize the inverting amplifier 206 whose gain is variable with a simple configuration, as compared with the inverting amplifier of the type using a variable resistor or the like.

The output buffer 208 may be formed by a CMOS (Complementary Metal Oxide Semiconductor), for example. The output buffer 208 generates a signal (pulse signal) representing the oscillation state of the crystal oscillator 100 based on the input signal (the signal inverted and amplified by the inverting amplifier 206). The output buffer 208 outputs "voltage VOH" when the level of the input signal (hereinafter also referred to as "input level") exceeds a first threshold value and outputs "voltage VOL" when the input level becomes lower than a second threshold value. It is noted that the first threshold value and the second threshold value may be set to the same or may be set differently, depending on a voltage value (threshold level) at which a P-type MOS and a N-type MOS, which form the CMOS of the output buffer 208, are turned on/off. In this way, in the example illustrated in FIG. 5, the output of the crystal oscillator 100 is not directly output from the crystal oscillator 100 but is output to the clock output terminal 220 via the output buffer 208.

The alarm issuing circuit 250 has a drive function of driving the light emitting element 90 to cause light emitted from the light emitting element 90 in the oscillating state of the crystal oscillator 100.

Further, the alarm issuing circuit 250 has a function (hereinafter referred to as "pre-output stop state detection function") for detecting a state (hereinafter referred to as "pre-output stop state") before the crystal oscillator 100 stops outputting. It is noted that, the fact that the crystal oscillator 100 stops outputting means that the oscillation circuit stops outputting. The fact that the crystal oscillator 100 stops outputting means the transition to the state in which the output from the output buffer 208 does not change (i.e., the state in which a normal output, which alters between "VOH" and "VOL" at the cycle corresponding to the output frequency of the crystal oscillator 100, cannot be obtained.

The alarm issuing circuit 250 is electrically connected to the light emitting element 90. The alarm issuing circuit 250 realizes the pre-output stop state detection function by monitoring a signal (hereinafter also referred to as a "light reception signal") representing the intensity (received light amount) of reflected light received by the light receiving element 92. The alarm issuing circuit 250 generates an alarm when the amplitude (an example of an index value) of the light reception signal becomes equal to or less than a predetermined reference value R. The amplitude of the signal may be based on the difference between the maximum value and the average value of the level of the signal for the most recent predetermined period, the difference between the average value and the minimum value of the level of the signal for the latest predetermined period, half of the difference between the maximum value and the minimum value of the level of the signal for the latest predetermined period, etc. It is noted that the alarm issuing circuit 250 may use the maximum value (another example of an index value)

of the level of the signal for the latest predetermined period as the amplitude. This is because, for example, the maximum value of the signal level of the most recent one cycle is correlated with the amplitude of the same signal in the same cycle. Alternatively, the alarm issuing circuit 250 may use an integrated value (another example of an index value) of the amplitude values of the signal over the latest predetermined period as the amplitude.

As described above, the reference value β is set to a value greater than the amplitude Em of the light reception signal when the amplitude of the input to the output buffer 208 becomes the input lower limit value. For example, the reference value β may be β=1.1×Em or β>1.1×Em. The input lower limit value of the output buffer 208 corresponds to the lower limit value of the input level (magnitude of the input voltage) to the output buffer 208 when the output is obtained from the output buffer 208. That is, even if the input to the output buffer 208 alters periodically, a significant output from the output buffer 208 (an output that can function as a clock source) cannot be obtained in a state in which the level of the input to the output buffer 208 is below a certain lower limit value and thus the CMOS is not turned on/off. The input lower limit value of the output buffer 208 corresponds to the lower limit value. It is noted that the reference value β may be uniformly set based on a design value of the input lower limit value of the output buffer 208. Alternatively, the reference value β may be set for each individual based on measured values for individuals, corresponding to input lower limit values or the like which may differ for each individual of the output buffer 208. In this case, for example, the reference value β may be set based on an actually measured value at the time of shipment of a product including the crystal oscillator 100 and the IC 200 (for example, an actually measured value of the amplitude Em).

The alarm generated by the alarm issuing circuit 250 is output to the outside via the alarm output terminal 222 and input to the gain control circuit 260. It is noted that the alarm output via the alarm output terminal 222 may be transmitted to, for example, an external user device (not illustrated). When the output of the crystal oscillator 100 functions as a clock of the communication control device, the user device may be, for example, a central management server that manages a base station or the like. In this case, the alarm may be a signal causing an alarm output including a voice or a display, or may include information of an index value (for example, the current value of the amplitude of the light reception signal) representing the lowered state of the current oscillation level. Upon receipt of such an alarm output, for example, a user who is a telecommunications carrier, can plan the repair/replacement work for the communication control device that includes the crystal oscillator 100 (the crystal oscillator 100 in which the pre-output stop state was detected).

The gain control circuit 260 has a function of increasing the gain of the inverting amplifier 206 in synchronization with the occurrence of the alarm. That is, when an alarm from the alarm issuing circuit 250 is input, the gain control circuit 260 increases the gain of the inverting amplifier 206 from a first value to a second value. The second value is significantly greater than the first value, for example the maximum value of the variable range. This increases the amplitude of the output from the inverting amplifier 206 and increases the amplitude of the input to the output buffer 208. In the example illustrated in FIG. 6, when the alarm from the alarm issuing circuit 250 is input, the gain control circuit 260 controls the switch SW to switch from the first state to the second state (see the arrow in FIG. 6). As a result, the gain of the inverting amplifier 206 increases from R2/R1 to R3/R1.

The gain control circuit 260 maintains the gain of the inverting amplifier 206 at the first value until the alarm from the alarm issuing circuit 250 is input, and when the alarm is input, the gain of the inverting amplifier 206 is set to the second value, and thereafter, the gain of the inverting amplifier 206 is maintained at the second value. In this case, the first value (R2/R1) is smaller than the second value (R3/R1). Accordingly, while power saving is implemented until the alarm from the alarm issuing circuit 250 is input, the state in which the gain of the inverting amplifier 206 is increased can be maintained after the alarm from the alarm issuing circuit 250 is input.

The reference voltage generating unit 270 generates a voltage corresponding to the reference value β used in the alarm issuing circuit 250. For example, the voltage generated by the reference voltage generating unit 270 may be input to a comparator (not illustrated) of the alarm issuing circuit 250.

Next, with reference to FIGS. 7 to 9D, effects of the first embodiment are described. Hereinafter, in some cases, the effects of the first embodiment will be described in comparison with a comparative example which does not include the gain control circuit 260.

FIG. 7 is an explanatory diagram of characteristics in a case where the crystal oscillator 100 is a normal product.

FIG. 7 illustrates, on the upper side, a frequency characteristic diagram illustrating the time-varying characteristics of the output frequency of the crystal oscillator 100, taking the time on the horizontal axis and the output frequency of the crystal oscillator 100 on the vertical axis. In the frequency characteristic diagram, a frequency standard lower limit value with respect to the output frequency of the crystal oscillator 100 is illustrated, and the time variation characteristic F1 related to a normal product is illustrated.

FIG. 7 illustrates, on the lower side, an output change characteristic diagram indicating the time-varying characteristics C1a, C1b, C1c of the amplitudes at each point A, B, C, respectively, taking the time on the horizontal axis and the amplitude of the signal appearing at each point A, B, C in the oscillation circuit illustrated in FIG. 5 on the vertical axis. In the output change characteristic diagram, the input lower limit value of the output buffer 208 is also illustrated.

In the case of a normal product, the output frequency of the crystal oscillator 100 decreases from the value f0 in a proportional manner with respect to the exponential increase in time, as illustrated by the time variation characteristic F1 on the upper side of FIG. 7 due to aging (aged deterioration). However, in the case of a normal product, the output frequency of the crystal oscillator 100 does not fall below the frequency standard lower limit value before the design life (for example, 6 years). It is noted that the main cause of the frequency change is the oxidation of the excitation electrodes 20 of the crystal oscillator 100. The amount of the frequency change due to aging can be controlled to some extent by management of the manufacturing process or the like. If the crystal oscillator 100 is as designed, the output frequency of the crystal oscillator 100 does not fall below the frequency standard lower limit value before the design life, as illustrated in FIG. 7.

In the case of a normal product, the amplitude of the signal appearing at the point B in the oscillation circuit illustrated in FIG. 5 decreases due to aging as indicated by the time variation characteristic C1b on the lower side of FIG. 7. As in the case of the frequency change, the main cause of the amplitude change is the mass increase due to the oxidation of the excitation electrode 20 of the crystal oscillator 100. However, in the case of a normal product, before the design life, the amplitude of the signal appearing at the point B illustrated in FIG. 5 does not fall below the input lower limit value of the output buffer 208. That is, if the crystal oscillator device is configured as designed, the amplitude of the input to the output buffer 208 does not fall below the input lower limit value before the design life. Therefore, in the case of a normal product, the amplitude of the signal appearing at the point C illustrated in FIG. 5 does not change and is constant as indicated by the time variation characteristic C1c on the lower side of FIG. 7. That is, in the case of a normal product, until the design life, the output (that is, normal output) switching between "VOH" and "VOL" at the cycle corresponding to the output frequency of the crystal oscillator 100 can be obtained at the point C illustrated in FIG. 5.

Figure 9B:
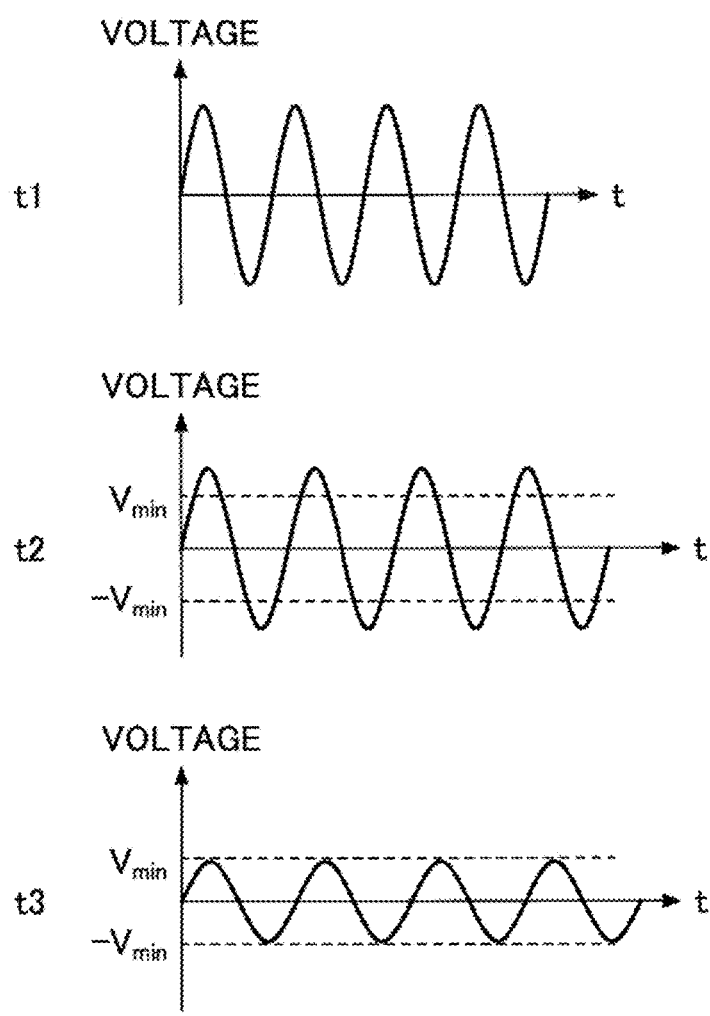
FIG. 9B is a diagram illustrating a time-series waveform of a signal appearing at a point B in the case of an abnormal product.
Figure 9D:
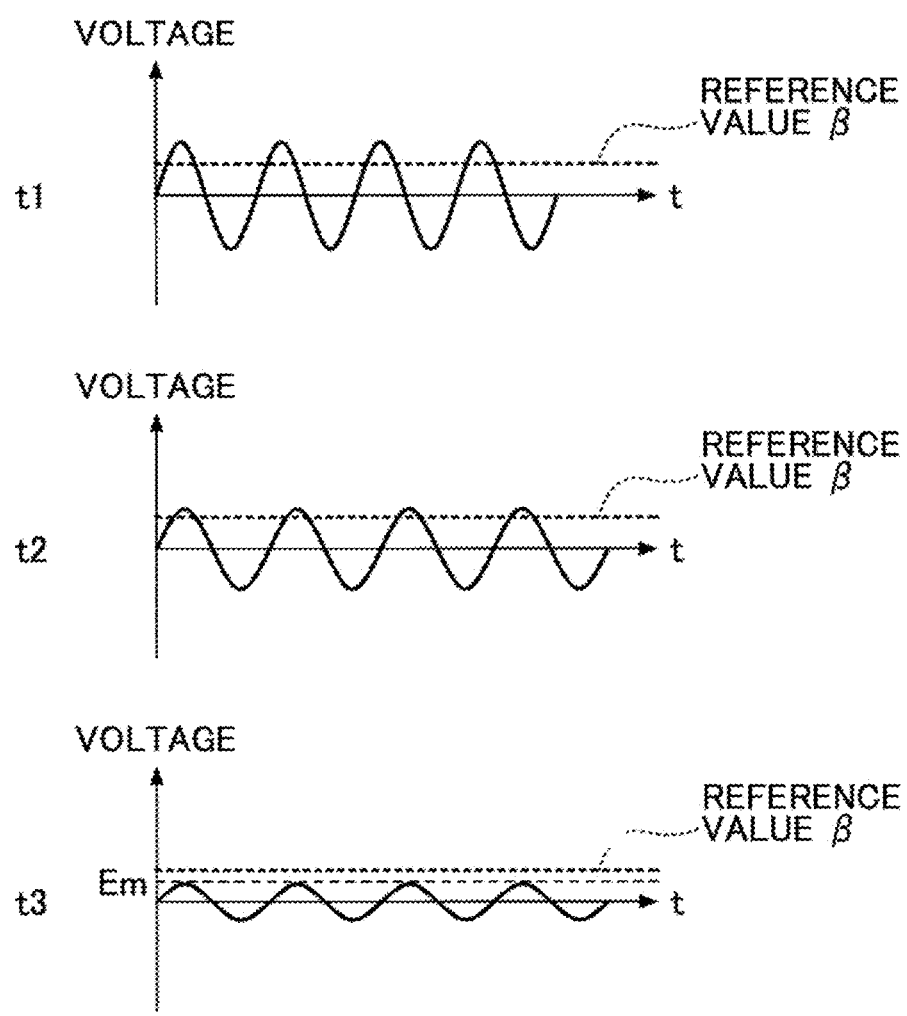
FIG. 9D is a diagram illustrating a time-series waveform of a signal appearing in the received light signal in the case of an abnormal product.

FIGS. 8 to 9D are explanatory diagrams of output stoppage of the crystal oscillator 100 caused by abnormality. In FIG. 8, t1 represents a time point at which the crystal oscillator 100 starts to operate, t2 represents a time point immediately before the crystal oscillator 100 stops outputting, t3 represents a time point when the crystal oscillator 100 stops outputting, and t4 represents the point of design life.

FIG. 8 illustrates, on the upper side, a frequency characteristic diagram illustrating the time-varying characteristics of the output frequency of the crystal oscillator 100, taking the time on the horizontal axis and the output frequency of the crystal oscillator 100 on the vertical axis. In the frequency characteristic diagram, the frequency standard lower limit value with respect to the output frequency of the crystal oscillator 100 is illustrated, and the time variation characteristic F1 (dotted line) related to a normal product and the time variation characteristic F2 (solid line) related to an abnormal product that stops outputting before the design life are illustrated. As an example, the time variation characteristic F2 relating to an abnormal product indicates a case where the output stops after about 100 days from the start of operation.

FIG. 8 illustrates, on the lower side, an output change characteristic diagram indicating the time-varying characteristics C2a, C2b, C2c (i.e., the time-varying characteristics related to an abnormal product) of the amplitudes at each point A, B, C, respectively, taking the time on the horizontal axis and the amplitude of the signal appearing at each point A, B, C in the oscillation circuit illustrated in FIG. 5 on the vertical axis. In the output change characteristic diagram, the input lower limit value of the output buffer 208, and the time variation characteristic C1c (dotted line) related to a normal product are also illustrated.

FIGS. 9A to 9D are diagrams illustrating time-series waveforms of the signal appearing in the case of an abnormal product. FIG. 9A illustrates the waveform of the signal appearing at point A illustrated in FIG. 5. FIG. 9B illustrates the waveform of the signal appearing at point B illustrated in FIG. 5. FIG. 9C illustrates the waveform of the signal appearing at point C illustrated in FIG. 5. FIG. 9D illustrates the waveform of the signal appearing in the coil 92. In FIG. 9A to FIG. 9D, from the top, the waveform within a certain time period from the time point t1, the waveform within a certain time period before time point t2, and the waveform within a certain time period from time point t3 are illustrated. In FIG. 9B, a positive voltage value Vmin having the same magnitude as the input lower limit value and a negative voltage value Vmin having the same magnitude as the input lower limit value are also illustrated. In addition, in FIG. 9C, the voltage level "High" to be exceeded in a positive direction by the output VOH and the voltage level "Low" to be exceeded in a negative direction by the output VOL are also illustrated. In addition, the reference value $\beta$ is also illustrated in FIG. 9D.

Here, there are cases where the decrease rate of the output frequency of the crystal oscillator 100 and the oscillation level become significant due to abnormality of a manufacturing process or contamination from contaminants. In such a case, an abnormal product that causes output stoppage before the design life may be generated.

Specifically, in the case of an abnormal product, the output frequency of the crystal oscillator 100 decreases from the initial value f0 with decrease speed significantly higher than the decrease speed due to aging in a normal product, as illustrated in the time variation characteristic F2 on the upper side of FIG. 8. In the case where the output of the crystal oscillator 100 is used as the clock of the standalone system, even if the frequency decrease progresses up to the time t2, there is a possibility that the frequency decrease may be permissible with a slight decrease in calculation speed. However, at time t3, the output suddenly stops and the whole system goes down.

More specifically, in the case of an abnormal product, the amplitude of the signal appearing at the point A in the oscillation circuit illustrated in FIG. 5 decreases by a significantly greater amount than the decrease amount due to aging in the case of a normal product, as illustrated in the time variation characteristic C2a on the lower side in FIG. 8 and FIG. 9A. Correspondingly, in the case of an abnormal product, the amplitude of the signal appearing at the point B in the oscillation circuit illustrated in FIG. 5 decreases by a significantly greater amount than the decrease amount due to aging in the case of a normal product, as illustrated in the time variation characteristic C2b on the lower side in FIG. 8 and FIG. 9B. Thus, in the case of an abnormal product, before the design life, the amplitude of the signal appearing at the point B illustrated in FIG. 5 may fall below the input lower limit value of the output buffer 208.

In this respect, in the case of an abnormal product illustrated in FIG. 8, in the comparative example, the amplitude of the signal appearing at the point B in the oscillation circuit illustrated in FIG. 5 falls below the input lower limit value of the output buffer 208 at the time t3, as illustrated in the time variation characteristic C2b on the lower side of FIG. 8 and FIG. 9B. In this way, in the case of an abnormal product illustrated in FIG. 8, the amplitude of the signal appearing at the point B in the oscillation circuit illustrated in FIG. 5, that is, the amplitude of the input to the output buffer 208 falls below the input lower limit value before the design life. If the amplitude of the input to the output buffer 208 falls below the input lower limit value of the output buffer 208, the signal level appearing at the point C illustrated in FIG. 5 becomes a constant value 0, as illustrated in the time variation characteristic C2c on the lower side of FIG. 8 and FIG. 9C. That is, prior to the design life, the crystal oscillator 100 stops outputting while the crystal oscillator 100 remains in the oscillation state (see FIG. 9A).

Here, the abnormality of the crystal oscillator 100 often causes abnormal frequency change. Since the oscillation circuit including the crystal oscillator 100 itself is a clock generation source, a reference clock with higher accuracy may be required to directly detect the frequency change of the crystal oscillator 100. Therefore, it is difficult to detect the abnormality in the frequency of the crystal oscillator 100

(for example, a characteristic like the time variation characteristic F2 in FIG. 8) by a simple method.

In this respect, the frequency change of the crystal oscillator 100 due to contamination from contaminants or the like correlates with the change (decrease) in the oscillation level of the crystal oscillator 100 as illustrated in FIGS. 7 and 8. This is because, in the case where the mass of the excitation electrodes 20 is increased due to contamination from contaminants, for example, both the output frequency and the oscillation level of the crystal oscillator 10 (the crystal oscillator 100) are reduced due to the mass increase. Therefore, even when the frequency change of the crystal oscillator 100 cannot be directly detected, it may be possible to indirectly detect the frequency change of the crystal oscillator 100 by monitoring the oscillation level of the crystal oscillator 100. It is noted that, in this specification, the expression "oscillation level of the crystal oscillator" and the expression "oscillation level of the crystal piece are used interchangeably.

On the other hand, as described above, the output of the crystal oscillator 100 is not directly output from the oscillation circuit including the crystal oscillator 100 but output through the output buffer 208. As illustrated in FIG. 8, etc., as long as the amplitude of the input exceeds the input lower limit value of the output buffer 208, the output of the output buffer 208 oscillates between the output VOH and the output VOL at the frequency that corresponds to the output frequency, even in the case of an abnormal product. The levels of the output VOH and the output VOL are substantially constant as long as the amplitude of the input exceeds the input lower limit value of the output buffer 208 even in the case of an abnormal product. Therefore, based on the output from the output buffer 208, it is not possible to directly read the abnormality of the oscillation circuit (for example, the abnormality of the crystal oscillator 100). Therefore, the failure of the oscillation circuit including the crystal oscillator 100 is often recognized only when its output falls below the standard (for example, the frequency standard lower limit value) or when the output stops. It is noted that there may be often the case that the main cause of failure of the oscillation circuit resulted from the crystal oscillator 100 included therein.

As described above, the abnormality of the crystal oscillator 100 is often known only after the crystal oscillator 100 has stopped outputting. This means that the repair/replacement timing of the crystal oscillator 100 suddenly comes in, which is significantly inconvenient for a user of a system using an output from the oscillation circuit including the crystal oscillator 100 as a clock source. Especially, when the crystal oscillator 100 is used in a system that requires high reliability, the adverse effect when the system suddenly goes down may be significant. In addition, when the crystal oscillator 100 is used in a relay station device or the like installed in a remote mountainous area or the like, it may take time to repair or exchange it, which may increase the down time of the system. Although such a disadvantage can be avoided to some extent by providing a redundant system, providing a redundant system adds cost.

In this regard, according to the first embodiment, as described above, the alarm issuing circuit 250 generates the alarm when the amplitude of the light reception signal received by the light receiving element 92 becomes equal to or less than the reference value β. As described above, the reference value β is set to a value greater than the amplitude Em of the light reception signal when the amplitude of the input to the output buffer 208 becomes the input lower limit value. Therefore, according to the first embodiment, the alarm can be generated by the alarm issuing circuit 250 before the amplitude of the signal appearing at the point B in the oscillation circuit illustrated in FIG. 5 falls below the input lower limit value of the output buffer 208. As a result, it is possible to notify the user of the system using the output from the oscillation circuit including the crystal oscillator 100 as the clock source in advance the necessity of repair/replacement due to the alarm. That is, before the crystal oscillator 100 stops outputting, the user can be notified of necessity of repair/replacement by the alarm in advance. As a result, it is possible to avoid situations where the system suddenly goes down if the user, who is notified of necessity of repair/replacement by the alarm in advance, plans appropriate repair/replacement work.

In addition, according to the first embodiment, as described above, the gain control circuit 260 increases the gain of the inverting amplifier 206 in synchronization with the occurrence of the alarm. When the gain of the inverting amplifier 206 is increased, the amplitude of the output from the inverting amplifier 206 (the amplitude of the input to the output buffer 208) increases. Therefore, according to the first embodiment, the amplitude of the input to the output buffer 208 can be increased in synchronization with the occurrence of the alarm, and as a result, the period until the crystal oscillator 100 stops outputting can be extended. That is, according to the first embodiment, even in the case of an abnormal product, the period until the crystal oscillator 100 stops outputting can be extended in response to the occurrence of the alarm. As a result, it becomes easier for the user to secure the necessary time for executing appropriate repair/replacement work. This effect is particularly useful when the crystal oscillator 100 is used for a relay station apparatus or the like installed in a remote mountainous area or the like. This is because, in such a case, it takes time for repair and exchange work in many cases.

Further, in the above-described first embodiment, since the output of the crystal oscillator 100 in the oscillating state can be optically monitored via the light emitting element 90 and the light receiving element 92, a monitoring system independent of the oscillation circuit can be formed. Therefore, according to the first embodiment, it is possible to monitor the output of the crystal oscillator 100 in the oscillating state in a manner that does not affect the oscillation circuit.

FIG. 10 is a diagram explaining an example of an operation according to the first embodiment. In FIG. 10, t1 represents a time point at which the crystal oscillator 100 starts to operate, t5 represents a detection time of the pre-output stop state, t6 represents a time point when the crystal oscillator 100 stops outputting, and t4 represents the point of design life. Further, in FIG. 10, the output stop time t3 in the case of FIG. 8 is illustrated for comparison. FIG. 10 illustrates a case where the crystal oscillator 100 is not repaired or replaced until the crystal oscillator 100 stops outputting.

FIG. 10 illustrates, as in the case of FIG. 8 described above, on the upper side, a frequency characteristic diagram illustrating the time-varying characteristics of the output frequency of the crystal oscillator 100, taking the time on the horizontal axis and the output frequency of the crystal oscillator 100 on the vertical axis. In the frequency characteristic diagram, the frequency standard lower limit value with respect to the output frequency of the crystal oscillator 100 is illustrated, and the time variation characteristic F1 (dotted line) related to a normal product and the time variation characteristic F3 (solid line) related to an abnormal product that stops outputting before the design life are illustrated. The abnormal product in FIG. 10 is assumed to be the same as the abnormal product in FIG. 8.

FIG. 10 illustrates, similar to FIG. 8, on the lower side, an output change characteristic diagram indicating the time-varying characteristics C3a, C3b, C3c, C3d (i.e., the time-varying characteristics related to an abnormal product), taking the time on the horizontal axis and the amplitude. Time-varying characteristics C3d is the time-varying characteristics of the amplitude of the light reception signal appearing in the light receiving element 92 (the same characteristics according to an abnormal product). In the output change characteristic diagram, the input lower limit value of the output buffer 208, the reference value β, and the time variation characteristic C1c (dotted line) related to a normal product are also illustrated.

In the case of an abnormal product, similar to FIG. 8, the output frequency of the crystal oscillator 100 is significantly higher than the decrease speed due to aging in a normal product, as illustrated in the time variation characteristic F3 on the upper side of FIG. 10. However, in the first embodiment, as described above, unlike FIG. 8, the gain control circuit 260 functions to prevent the entire system from stopping outputting and thus being down at time t3. That is, even in the case of an abnormal product, as illustrated in the time varying characteristic F3 at the top of FIG. 10, until time t6 after time t3, it is possible to delay the timing at which the entire system is down. It is noted that, in the example illustrated in FIG. 10, a timing when the output frequency of the crystal oscillator 100 falls below the frequency standard lower limit value is the same as a timing when the entire system is down (i.e., the timing at which the level of the signal appearing at point C becomes the constant value 0); however, this is not indispensable. However, preferably, the timing, at which the output frequency of the crystal oscillator 100 falls below the frequency standard lower limit value, does not arrive before the timing at which the entire system is down.

Further, in the case of an abnormal product, the amplitude of the signal appearing at the point A in the oscillation circuit illustrated in FIG. 5 decreases by a significantly greater amount than the decrease due to aging in the case of a normal product, as illustrated in the time variation characteristic C3a on the lower side in FIG. 10. Thus, in the case of an abnormal product, the amplitude of the signal appearing at the point B in the oscillation circuit illustrated in FIG. 5 decreases by a significantly greater amount than the decrease due to aging in the case of a normal product, as illustrated in the time variation characteristic C3b on the lower side in FIG. 10. Thus, in the case of an abnormal product, similar to FIG. 8, before the design life, the amplitude of the signal appearing at the point B illustrated in FIG. 5 may fall below the input lower limit value of the output buffer 208.

In this regard, according to the first embodiment, as schematically illustrated by an arrow at the bottom of FIG. 10, the alarm is generated at time t5 at which the amplitude of the light reception signal appearing in the light receiving element 92 is equal to or less than a reference value β. Accordingly, the gain of the inverting amplifier 206 is increased, and, as illustrated in the time varying characteristic C3b at the lower side of FIG. 10, the amplitude (i.e., the amplitude of the input to the output buffer 208) of the signal appearing at point B in the oscillation circuit illustrated in FIG. 5 increases. It is noted that, accordingly, the oscillation level of the crystal oscillator 100 is increased, the amplitude of the signal appearing at point A in the oscillation circuit illustrated in FIG. 5 increases, as illustrated in the time varying characteristic C3a at the lower side of FIG. 10. Thus, at time t5, the amplitude of the signal appearing at point B in the oscillation circuit illustrated in FIG. 5 increases. However, because of an abnormal product, even at time t5, the amplitude of the signal appearing at point B in the oscillation circuit illustrated in FIG. 5 continues to decrease by the decrease amount significantly greater than the decrease amount due to the aging of a normal product. Then, before the design life, the amplitude of the signal appearing at the point B illustrated in FIG. 5 may fall below the input lower limit value of the output buffer 208. In the case of an abnormal product illustrated in FIG. 10, the amplitude of the signal appearing at the point B in the oscillation circuit illustrated in FIG. 5 falls below the input lower limit value of the output buffer 208 at the time t6, as illustrated in the time variation characteristic C3b on the lower side of FIG. 10. In this way, in the case of an abnormal product illustrated in FIG. 10, the amplitude of the signal appearing at the point B in the oscillation circuit illustrated in FIG. 5, that is, the amplitude of the input to the output buffer 208 falls below the input lower limit value before the design life, and thus the crystal oscillator 100 transitions to the output stop state. However, in the first embodiment, as can be seen in comparison with FIG. 8, a timing t6 when the crystal oscillator 100 transitions to the output stop state, comes later than the timing t3 in FIG. 8. That is, in the first embodiment, even in the case of an abnormal product, as compared with the comparative example, the timing when the crystal oscillator 100 transitions to the output stop state can be delayed. In other words, in the first embodiment, as compared with the comparative example, the repair or replacement timing of the crystal oscillator 100 can be delayed by a period of time t3 to time t6. It is noted that, in the example illustrated in FIG. 10, if the repair or replacement of the crystal oscillator 100 is performed during the period from time t3 to time t6, it is possible to avoid a situation where the system ends up down suddenly at time t6.

It is noted that, in the first embodiment described above, the functions of the alarm issuing circuit 250, the gain control circuit 260, and the reference voltage generating unit 270 are implemented by the IC 200; however, at least a part of the functions may be realized by a computer. For example, the functions of the alarm issuing circuit 250 and the gain control circuit 260 may be implemented by a CPU of the computer executing a program, and the function of the reference voltage generating unit 270 may be implemented by a memory of the computer.

Next, upper excitation electrodes according to other examples, which may be used to replace the upper excitation electrode 21 of the crystal oscillator 100 according to the first embodiment described above, are described.

Figure 11:
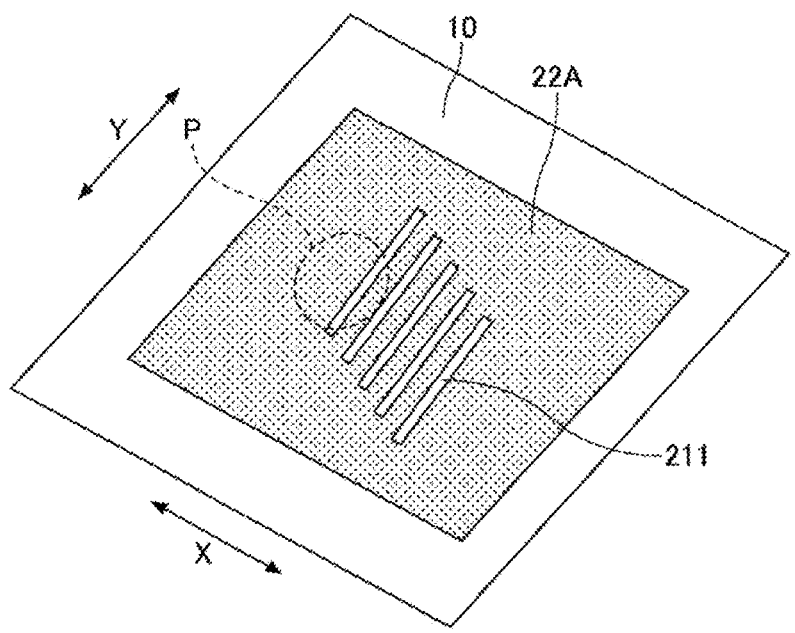
FIG. 11 is a perspective view illustrating a lower excitation electrode according to another example.

FIG. 11 is a perspective view illustrating a lower excitation electrode 22A according to another example. In FIG. 11, only the crystal piece 10 and the lower excitation electrode 22A are illustrated, and an impingement portion P of the light Lg from the light emitting element 90 (see FIG. 1B) is also illustrated.

In the example illustrated in FIG. 11, a lower excitation electrode 22A has a plurality of slits (an example of a hole) 211. The slits 211 penetrate the lower excitation electrode 22A. In the example illustrated in FIG. 11, the slits 211 are elongated long holes in Y direction perpendicular to X direction. However, the longitudinal direction of the slits 211 may be inclined with respect to Y direction perpendicular to X direction or may be parallel to X direction.

The impingement portion P, as illustrated in FIG. 11, includes an edge portions of around the slits 211 of the lower excitation electrode 22A, and portions of the crystal piece 10 adjacent to the edge portions in X direction. That is, the light emitting element 90 emits the light to simultaneously impinge on the edge portions of around the slits 211 of the lower excitation electrode 22A and the portions of the crystal piece 10 adjacent to the edge portions in X direction. Thus, on the basis of the light reception signal whose amplitude changes due to change in the oscillation level of the crystal oscillator 100, it is possible to measure the oscillation level of the crystal oscillator 100.

It is noted that, in the example illustrated in FIG. 11, five slits 211 are formed in the same shape; however, the number and shape of the slits 211 are arbitrary. The slits 211 are formed for the purpose of changing the area of the part of the impingement portion P related to the lower excitation electrode 22A in accordance with the vibration of the crystal piece 10, as described above. Thus, preferably, the slits 211 are within such a range of the lower excitation electrode 22A that the slits 211 are included at least temporarily in the impingement portion P during the vibration of the crystal piece 10.

Figure 12:
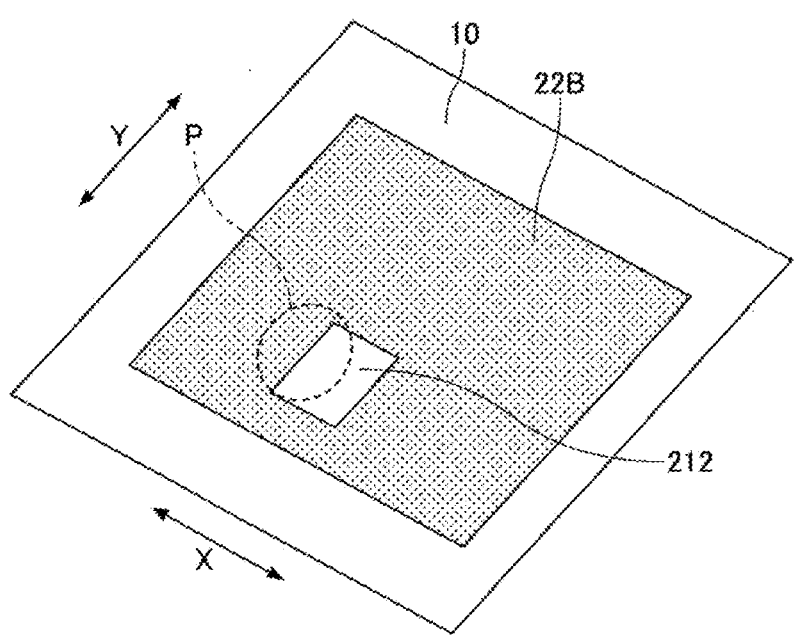
FIG. 12 is a perspective view illustrating a lower excitation electrode according to another example.

FIG. 12 is a perspective view illustrating a lower excitation electrode 22B according to yet another example. In FIG. 12, only the crystal piece 10 and the lower excitation electrode 22B are illustrated, and an impingement portion P of the light Lg from the light emitting element 90 (see FIG. 1B) is also illustrated.

In the example illustrated in FIG. 12, a lower excitation electrode 22B has a single hole 212. The hole 212 penetrates the lower excitation electrode 22B.

The impingement portion P, as illustrated in FIG. 12, includes an edge portion of around the hole 212 of the lower excitation electrode 22B, and a portion of the crystal piece 10 adjacent to the edge portion in X direction. That is, the light emitting element 90 emits the light to simultaneously impinge on the edge portion of around the hole 212 of the lower excitation electrode 22B and the portion of the crystal piece 10 adjacent to the edge portion in X direction. Thus, on the basis of the light reception signal whose amplitude changes due to change in the oscillation level of the crystal oscillator 100, it is possible to measure the oscillation level of the crystal oscillator 100.

Figure 13:
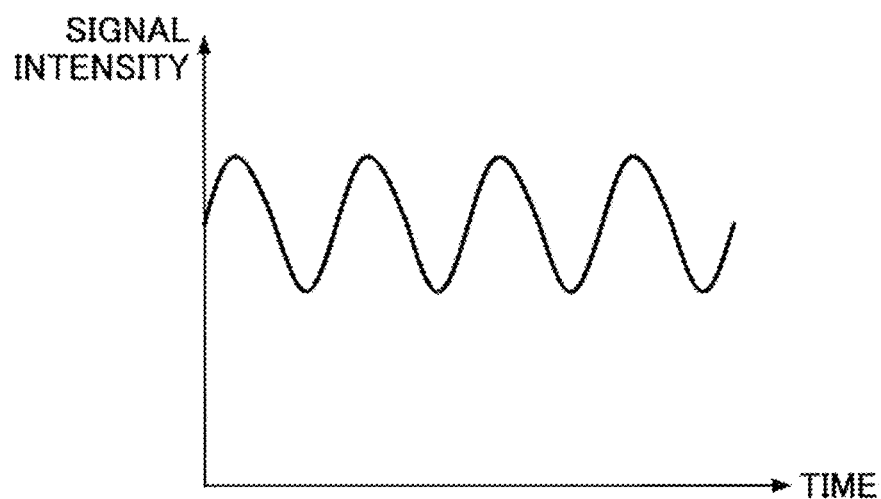
FIG. 13 is an explanatory diagram of an arrangement of light receiving elements according to another example.

FIG. 13 is a diagram illustrating a time-series waveform of the light amount of the reflected light received by the light receiving element 92 in the example illustrated in FIGS. 11 and 12. In FIG. 12, the amount of reflected light received by the light receiving element 92 is represented as the intensity (strength) of the light reception signal.

According to the example illustrated in FIGS. 11 and 12, as can be seen in comparison with FIG. 4 to FIG. 13, the amplitude of the time variation in the amount of reflected light received by the light receiving element 92 can be increased. This is because the crystal piece 10 vibrates such that the central portion thereof whose charge density higher than that of the peripheral portion is distorted greater than the peripheral portion, and thus the displacement of the central portion in X direction is greater than that of the peripheral portion during vibration of the crystal piece 10. It is noted that, for this purpose, preferably, the slits 211 and the hole 212 are formed such that the slits 211 and the hole 212 are near the center of the lower excitation electrodes 22A and 22B in X direction (i.e., the center of the lower excitation electrodes 22A and 22B are closer in X direction to the slits 211 and the hole 212 than the edge portion of the lower excitation electrodes 22A and 22B). In other words, the slits 211 and the hole 212 are formed such that the impingement portion P is positioned near the center portion of the lower excitation electrodes 22A and 22B in X direction. It is noted that, preferably, the slits 211 and the hole 212 are formed on the ends of the lower excitation electrodes 22A and 22B in Y direction perpendicular to X direction so that the slits 211 and the hole 212 do not affect the vibration characteristics of the crystal oscillator 100.

Figure 14:
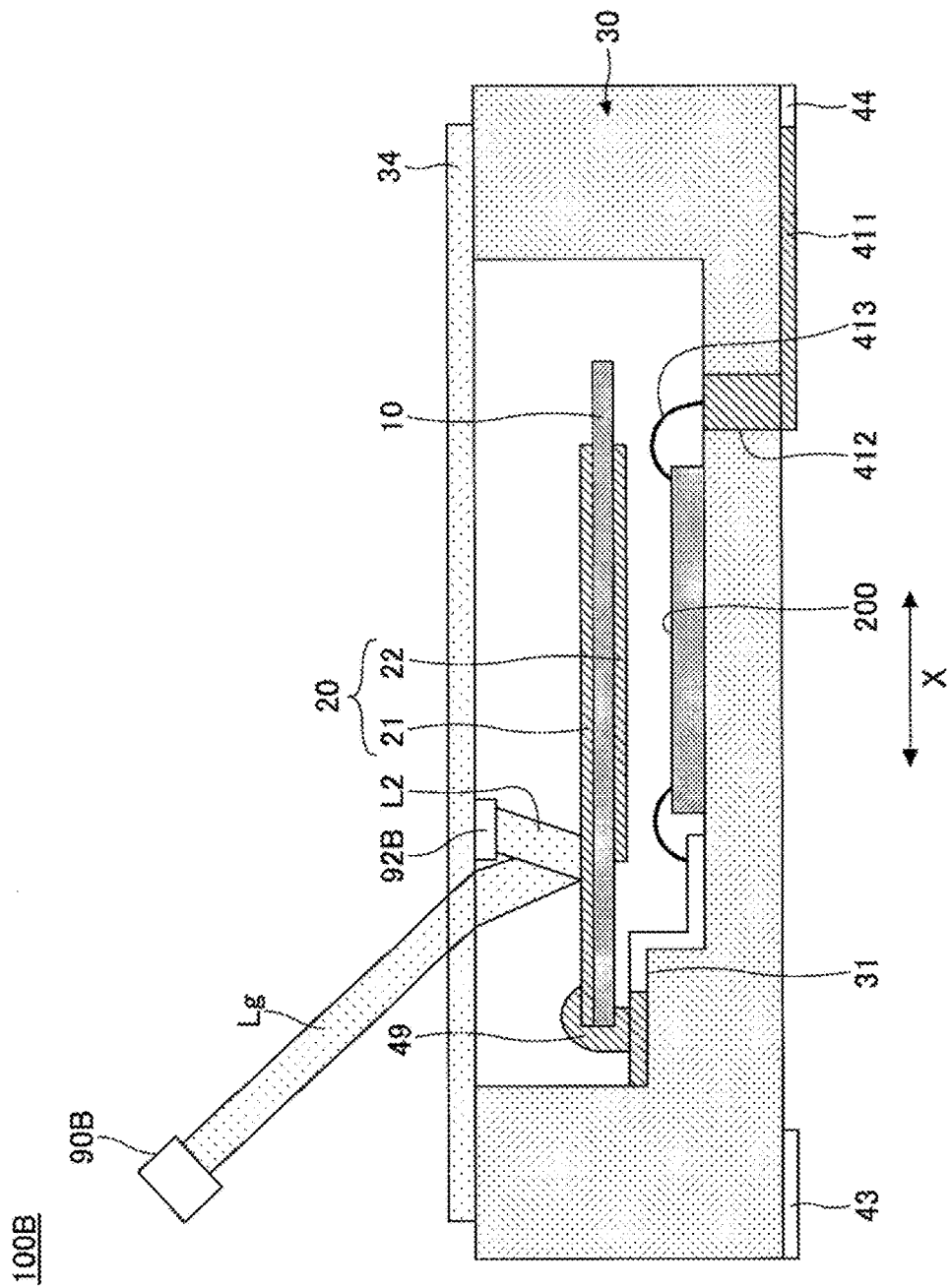
FIG. 14 is a cross-sectional view schematically illustrating a crystal oscillator according to another example.

It is noted that, in the first embodiment (the same applies to the examples illustrated in FIGS. 11 and 12), the light emitting element 90 and the light receiving element 92 are provided in the casing 30; however, this is not indispensable. For example, according to a crystal resonator 100B illustrated in FIG. 14, a light emitting element 90B is provided outside the casing 30. In FIG. 14, the reflected light L2 generated when the light Lg from the light emitting element 90B is reflected at the upper excitation electrode 21 is schematically illustrated. In this case, the lid 34 is formed by a material with light permeability. A light receiving element 92B is attached to the lower surface of the lid 34 such that the light receiving element 92B is capable of receiving the reflected light L2. Similarly, the light receiving element 92B is electrically connected to the IC 200. In the example illustrated in FIG. 14, similarly, the impingement portion (spot of a laser beam) includes the edge portion of the upper excitation electrode 21 and the portion of the crystal piece 10 adjacent to the edge portion in X direction. Also, in this case, on the basis of the light reception signal whose amplitude changes due to change in the oscillation level of the crystal oscillator 100B, it is possible to measure the oscillation level of the crystal oscillator 100B.

Second Embodiment

The crystal oscillator device according to the second embodiment differs from the crystal oscillator device according to the first embodiment in that the crystal oscillator 100 and IC 200 are replaced with the crystal oscillator 100F and IC 200C, respectively. The crystal oscillator 100C according to the second embodiment differs from the crystal oscillator 100 illustrated in FIG. 1 in that the upper excitation electrode 21 and the lower excitation electrode 22 are replaced with a upper excitation electrode 21C and a lower excitation electrode 22C, respectively. Further, the crystal oscillator 100C differs from the crystal oscillator 100 according to the first embodiment described above in that the light emitting element 90 and the light receiving element 92 are replaced with a light emitting element 90C and a camera 92C, respectively. Other elements of the crystal oscillator 100C according to the second embodiment may be the same as those of the crystal oscillator 100 according to the first embodiment described above, and explanation thereof is omitted.

Figure 15:
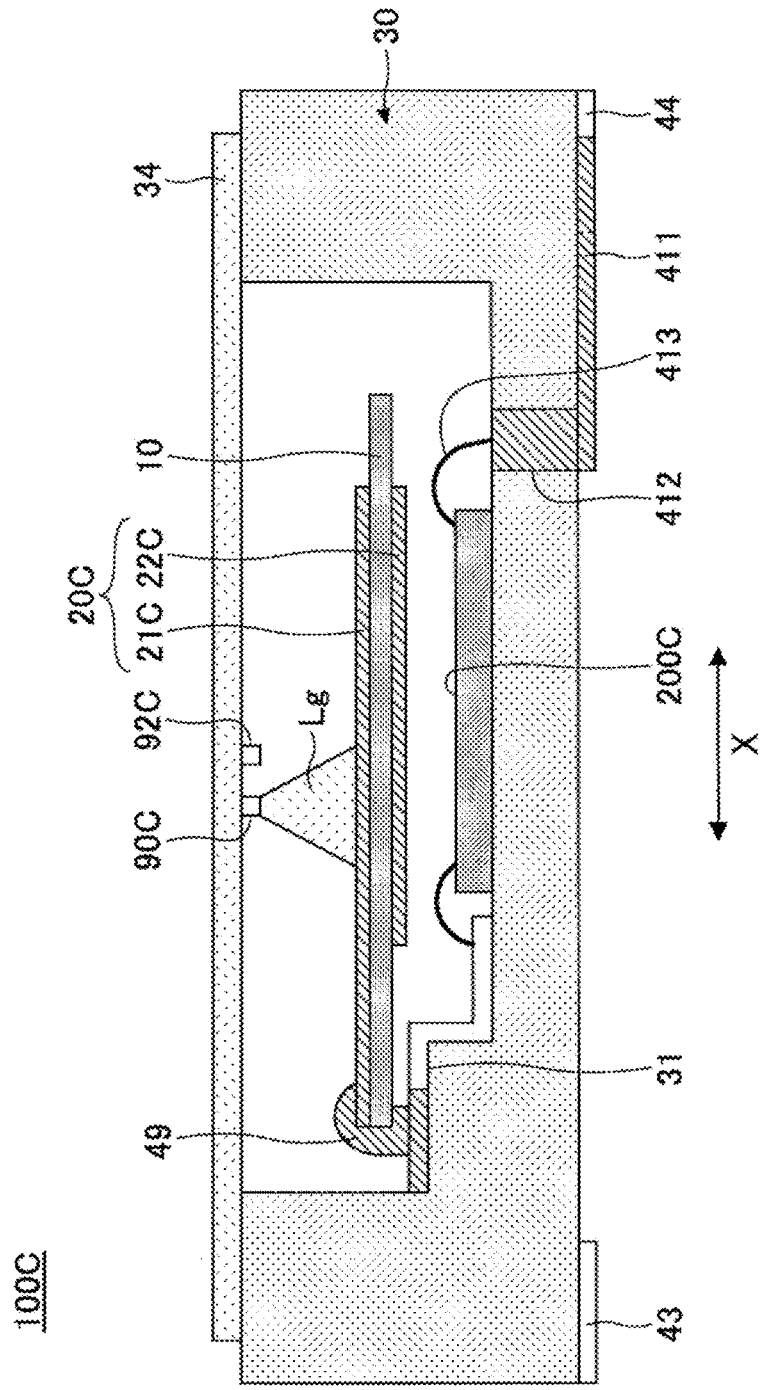
FIG. 15 is a schematic cross-sectional view of a crystal oscillator according to a second embodiment.

FIG. 15 is a schematic cross-sectional view of the crystal oscillator 100C. It is noted that FIG. 15 corresponds to a cross-sectional view along a line B-B in FIG. 1A. It is noted that, in FIG. 15, in addition to the crystal oscillator 100E, the IC 200C is also illustrated.

The light emitting element 90C is attached to the lower surface of the lid 34. The light emitting element 90C emits light toward a predetermined irradiation region (i.e., the area where a plurality of first slits 214 described hereinafter are formed) of the upper surface of the upper excitation electrode 21C.

The camera 92C includes, for example, a plurality of light receiving sensors (imaging sensors) arranged in a matrix. The camera 92C is attached to the lower surface of the lid 34 such that the camera 92C is capable of imaging a predetermined illumination area of the upper surface of the upper excitation electrode 21C. Similarly, the camera 92C is electrically connected to the IC 200C.

Figure 16:
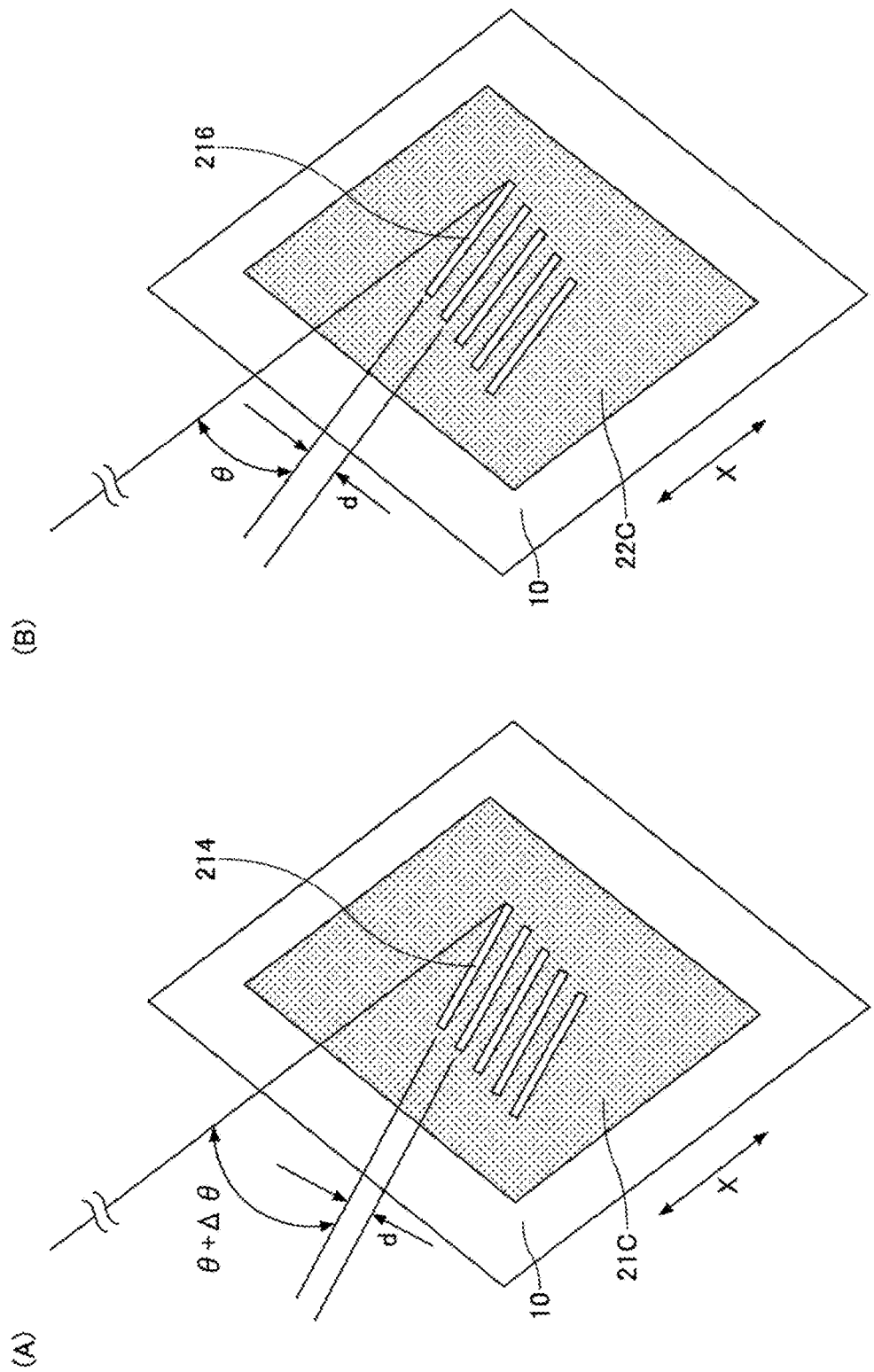
FIG. 16 is a view illustrating an upper excitation electrode and a lower excitation electrode according to the second embodiment.

FIG. 16 is a diagram illustrating an upper excitation electrode 21C and the lower excitation electrode 22C, in which (A) is a perspective view of the crystal piece 10 from the upper side, and (B) is a perspective view of the crystal piece 10 from the lower side. In FIG. 16, only the crystal piece 10, the upper excitation electrode 21C and the lower excitation electrode 22C are illustrated.

The upper excitation electrode 21C differs from the upper excitation electrode 21 of the crystal oscillator 100 illustrated in FIG. 1 in that the plurality of first slits 214 extending in a first direction are formed, as illustrated in FIG. 16 (A). The longitudinal direction (first direction) of the first slits 214 is inclined relative to X direction by a first angle (=θ+Δθ). Preferably, the first angle is 45 degrees or less. The first slits 214 are formed parallel to each other and the neighboring first slits 214 are spaced with a predetermined interval (pitch).

The lower excitation electrode 22C differs from the lower excitation electrode 22 of the crystal oscillator 100 illustrated in FIG. 1 in that the a plurality of second slits 216 extending in a second direction are formed, as illustrated in FIG. 16 (B). The longitudinal direction (first direction) of the second slits 216 is inclined relative to X direction by a second angle (equal to θ and not equal to the first angle). Preferably, the second angle is 45 degrees or less. The second slits 216 are formed parallel to each other and the neighboring second slits 216 are spaced with a predetermined interval (pitch). In the example illustrated in FIG. 16, the pitch d with which the second slits 216 are formed is the same as the pitch d with which the first slits 214 are formed; however, the pitch of the first slits 214 and the pitch of the second slits 216 may be different. Further, in the example illustrated in FIG. 16, the first angle and the second angle are not 0; however, the first angle or the second angle may be zero.

The second slit 216 intersects the first slit 214 in a view in a direction normal to the crystal piece 10 (also referred to as "in the normal direction view to the crystal piece 10") (i.e., when viewed in a direction perpendicular to the surface of the crystal piece 10). Preferably, the second slit 216 and the first slit 214 are formed such that two or more second slits 216 have intersections with one first slit 214 in the normal direction view to the crystal piece 10.

Figure 17:
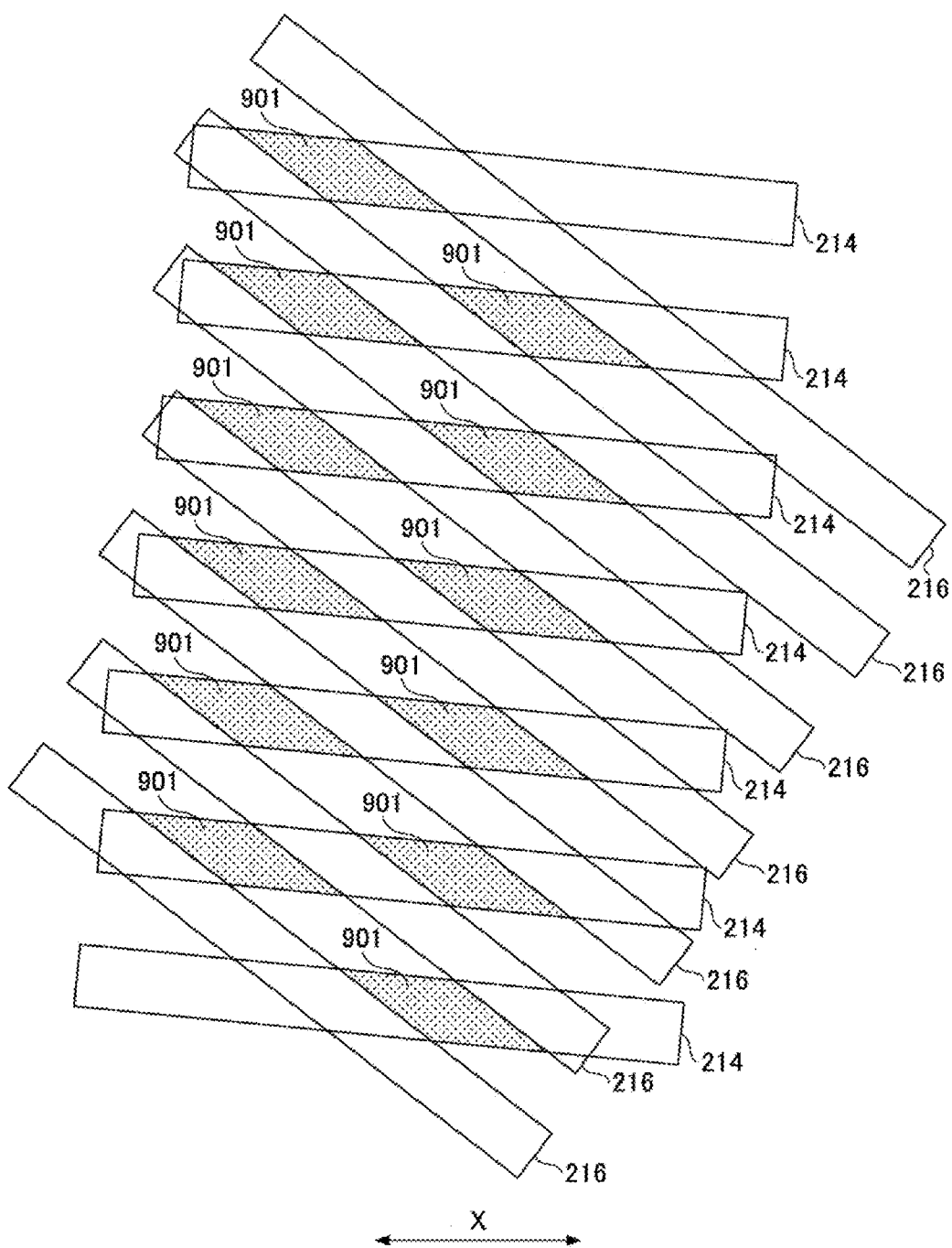
FIG. 17 is an explanatory diagram of an observation principle of moire fringes.

FIG. 17 is an explanatory diagram of the observation principle of moire fringes, and illustrates, by a hatched area 901, a reflection portion of the lower excitation electrode 22C in the normal direction view to the crystal piece 10. FIG. 17 transparently illustrates the relationship between the first slits 214 and second slits 216. In FIG. 17, for the sake of the convenience for the explanation of the observation principle, the number and shape of the first slits 214 and second slits 216 are illustrated in a different manner from the number and shape illustrated in FIG. 16.

In the oscillating state of the crystal oscillator 100C, when the light Lg impinges on the upper excitation electrode 21C, the upper excitation electrode 21C reflects the light as described above to generate the reflected light (not illustrated). On the other hand, the crystal piece 10 transmits the light and does not substantially reflect the light. Further, the lower the excitation electrode 22C reflects light as described above, and thus reflects the light incident through the first slits 214 to generate the reflected light (not illustrated). In this case, the reflection portions of the lower excitation electrode 22C are portions in which the second slits 216 are not formed. The reflection portions of the lower excitation electrode 22C are aligned in a direction substantially perpendicular to the longitudinal direction of the first slits 214, as illustrated schematically in FIG. 17. As a result, the moire fringes due to the first slits 214 and the second slits 216 become observable in the normal direction view to the crystal piece 10 and by the camera 92C, which is disposed above the upper excitation electrode 21C. That is, the camera 92C is disposed above the upper excitation electrode 21C to image the moire fringes formed when the upper excitation electrode 21C is illuminated.

Figure 18:
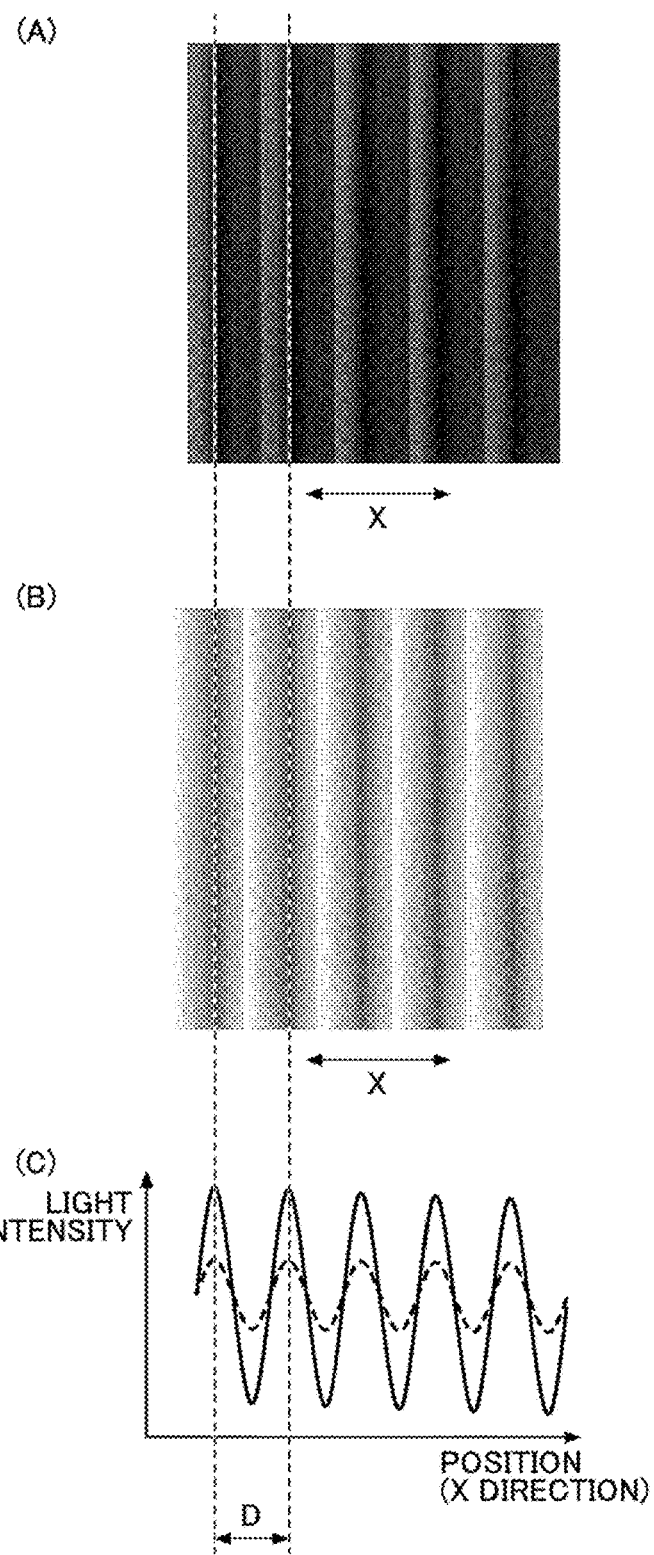
FIG. 18 is an explanatory diagram of a relationship between a moiré fringe observed by a camera and an oscillating state of a crystal oscillator.

FIG. 18 is an explanatory view of a relationship between the oscillating state of the crystal oscillator 100C and the moire fringes observed by the camera 92C. In FIG. 18, (A) schematically illustrates the moire fringes when the oscillation level of the crystal oscillator 100C is smaller, and (B) schematically illustrates the moire fringes when the oscillation level of the crystal oscillator 100C is greater. In (A) and (B) in FIG. 18, the difference in gray density of hatching represents the difference in density of the moire fringes such that the darker gray indicates the greater density (greater light amount). Further, in FIG. 18, (C) schematically illustrates the difference in density of the moire fringes in the form of a graph. In the example illustrated in FIG. 18, each stripe of the moire fringes has its longitudinal direction perpendicular to X direction; however, the longitudinal direction of the moire fringes may be inclined with respect to X direction. In this case, preferably, the inclination angle is 45 degrees or less.

A distance D between the moire fringes observed by the camera 92C (see FIG. 18) is expressed by the following equation.

$$D = d\{d/2 \sin(\Delta\theta/2)\} \approx d/\Delta\theta$$

It is noted that approximation is performed because Δθ is a very small angle.

The moire fringes observed by the camera 92C have the density varied in accordance with the oscillating state of the crystal oscillator 100C, as illustrated in FIG. 18. Specifically, as illustrated in (A) in FIG. 18, when the oscillation level of the crystal oscillator 100C is relatively small, the contrast of the moire fringes is relatively high. That is, the density of the moire fringes observed by the camera 92C is relatively dark. On the other hand, as illustrated in (B) in FIG. 18, when the oscillation level of the crystal oscillator 100C is relatively great, the contrast of the moire fringes is relatively low. That is, the density of the moire fringes observed by the camera 92C is relatively low. This is because if the upper excitation electrode 21C vibrates in X direction due to the oscillation of the crystal oscillator 100C, the portions of the lower excitation electrode 22C, which are visible by the camera 92C via the first slits 214, vibrate in X direction.

In (C) in FIG. 18, the light intensity when the oscillation level of the crystal oscillator 100C is relatively low is illustrated by the solid line, and the light intensity when the oscillation level of the crystal oscillator 100C is relatively great is indicated by a dotted line. In a state where the portions of the lower excitation electrode 22C, which are visible by the camera 92C via the first slits 214, vibrate in X direction, the intensity of light that can be received by one pixel in the camera 92C per unit time becomes smaller as the oscillation level of the crystal oscillator 100C becomes greater, as illustrated in (C) in FIG. 18. Therefore, by analyzing the density of the moire fringes observed by the camera 92C, it is seen that the oscillation level of the crystal oscillator 100C can be evaluated (measured).

Figure 19:
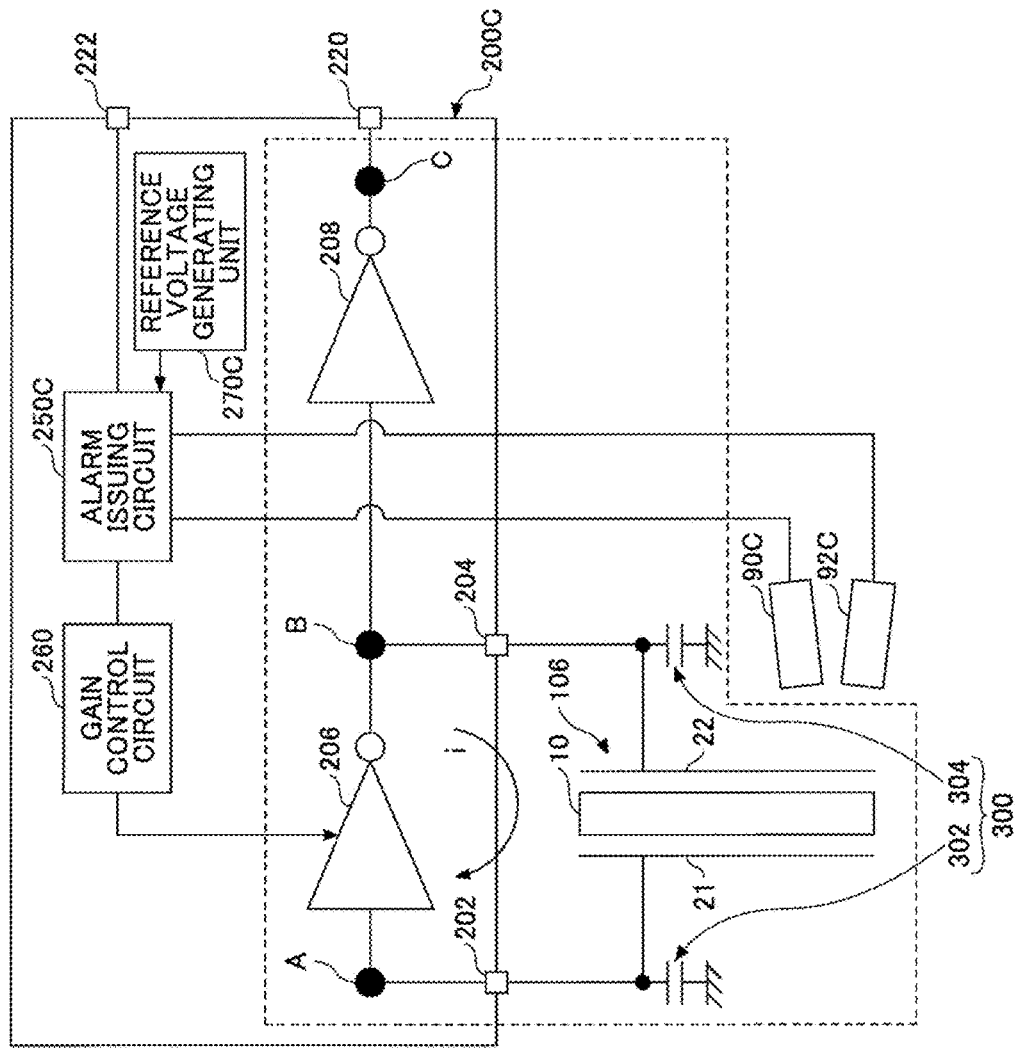
FIG. 19 is a diagram schematically illustrating an example (second embodiment) of a circuit configuration of a crystal oscillator device including a crystal oscillator and an IC.

FIG. 19 is a diagram schematically illustrating an example of a circuit configuration of the crystal oscillator 100 and the IC 200C. In FIG. 19, with respect to IC 200C, capacitors of terminals, stray capacitance of wiring patterns of the printed circuit board, resistance for limiting the current (see arrow i in FIG. 14) flowing through the crystal oscillator 100C, etc., are not illustrated. In FIG. 19, elements which may be the same as the corresponding elements according to the first embodiment described above are given the same reference numerals and their explanation is omitted.

The IC 200C differs from the IC 200 according to the first embodiment described above in that the alarm issuing circuit 250 and the reference voltage generating unit 270 are replaced with an alarm issuing circuit 250C and a reference voltage generating unit 270C, respectively. It is noted that the IC 200C forms an example of a crystal oscillator device together with the crystal oscillator 100C.

The alarm issuing circuit 250C has a drive function of driving the light emitting element 90C to cause light to be emitted from the light emitting element 90C in the oscillating state of the crystal oscillator 100C.

Further, the alarm issuing circuit 250C has a function (i.e., the pre-output stop state detection function) for detecting a state (i.e., the pre-output stop state) before the crystal oscillator 100C stops outputting. The alarm issuing circuit 250C is electrically connected to the camera 92C. The alarm issuing circuit 250C achieves the pre-output stop state detection function by monitoring the density of the moire fringes based on the light reception signal obtained by the camera 92C. For example, the alarm issuing circuit 250C generates an alarm when the density (another example of an index value) of the moire fringes becomes greater than or equal to a predetermined reference value $\beta 6$. The reference value $\beta 6$ is set to a value greater than the density Em' of the moire fringes when the amplitude of the input to the output buffer 208 becomes the input lower limit value. For example, the reference value $\beta 6$ may be $\beta 6 = 1.1 \times \text{Em}'$ or $\beta 6 > 1.1 \times \text{Em}'$. The reference value $\beta 6$ may be set in a manner similar to the reference value $\beta$ described above.

The reference voltage generator 270C generates a voltage corresponding to the reference value $\beta 6$ used in the alarm issuing circuit 250C.

Also, according to the second embodiment, the same effects as in the first embodiment can be obtained. That is, the output of the crystal oscillator 100C in the oscillating state can be monitored via the light emitting element 90C and camera 92C, and thus the pre-output stop state of the crystal oscillator 100C can be detected as well. And, at the time of detection of the pre-output stop state, the alarm can be issued, and the period up to the timing of the output stoppage of the crystal oscillator 100C can be extended by increasing the gain of the inverting amplifier 206. Further, according to the second embodiment, since the output of the crystal oscillator 100C in the oscillating state can be optically monitored via the light emitting element 90C and camera 92C, a monitoring system independent of the oscillation circuit can be formed. Therefore, according to the second embodiment, it is possible to monitor the output of the crystal oscillator 100C in the oscillating state in a manner that does not affect the oscillation circuit.

It is noted that, in the second embodiment described above, the functions of the alarm issuing circuit 250, the gain control circuit 260, and the reference voltage generating unit 270 are implemented by the IC 200; however, at least a part of the functions may be realized by a computer. For example, the functions of the alarm issuing circuit 250C and the gain control circuit 260C may be implemented by a CPU of the computer executing a program, and the function of the reference voltage generating unit 270C may be implemented by a memory of the computer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention. Further, all or part of the components of the embodiments described above can be combined.

What is claimed is:

1. A crystal oscillator device comprising:
   a casing;
   a crystal piece provided in the casing;
   a pair of excitation electrodes provided on the crystal piece;
   a light emitting element configured to emit light that is to be reflected by one of the excitation electrodes to generate reflected light;
   a light receiving element configured to receive the reflected light; and
   an alarm generator configured to generate an alarm based on a signal upon an index value being less than or equal to a reference value, the signal being generated in the light receiving element, the index value representing an oscillation level of the crystal piece in an oscillating state.

2. The crystal oscillator device of claim 1, wherein the reference value is greater than the index value that is obtained when an output of an oscillation circuit including the crystal piece stops.

3. The crystal oscillator device of claim 1, further comprising:
   an inverting amplifier electrically connected between the pair of excitation electrodes; and
   a gain control unit configured to increase a gain of the inverting amplifier when the index value becomes equal to or less than the reference value.

4. The crystal oscillator device of claim 3, wherein the inverting amplifier includes an operational amplifier, a first resistor, and a second resistor, the second resistor having a resistance value larger than that of the first resistor;
   the gain control unit switches from a first state, in which an inverting terminal of the operational amplifier is electrically connected to an output terminal of the operational amplifier via the first resistor, to a second state, in which the inverting terminal is electrically connected to the output terminal via the second resistor, to increase the gain.

5. The crystal oscillator device of claim 3, wherein the inverting amplifier, the alarm generator, and the gain control unit are provided in the casing.

6. The crystal oscillator device of claim 1, wherein the light emitting element and the light receiving element are formed in or on the casing.

7. The crystal oscillator device of claim 1, wherein the index value is an amplitude of the signal, the signal representing a strength of a light received by the light receiving element.

8. The crystal oscillator device of claim 1, wherein the light receiving element includes a plurality of imaging sensors included in a camera,
the one of the excitation electrodes has a plurality of first slits formed therein, and the other of the excitation electrodes has a plurality of second slits formed therein, the second slits having intersection with the first slits when viewed in a direction perpendicular to a surface of the crystal piece;
the light emitting element emits the light to impinge upon a range in which the first slits are formed, and
the index value is a depth of moire fringes formed by the reflected light.

9. The crystal oscillator device of claim 3, further comprising an output buffer provided on an output side of the inverting amplifier, the output buffer having a lower limit value for an input thereto, wherein
the reference value is greater than the index value obtained when an output of the inverting amplifier corresponds to the lower limit value.

10. The crystal oscillator device of claim 7, wherein the light emitting element causes an edge portion of the one of the excitation electrodes and a portion of the crystal piece to be illuminated by the light simultaneously, the portion of the crystal piece being adjacent to the edge portion in a vibration direction of the crystal piece.

11. The crystal oscillator device of claim 7, wherein the one of the excitation electrodes has a hole formed therein, and
the light emitting element causes an edge portion around the hole of the one of the excitation electrodes and a portion of the crystal piece to be illuminated by the light simultaneously, the portion of the crystal piece being adjacent to the edge portion in a vibration direction of the crystal piece.

12. The crystal oscillator device of claim 11, wherein a center of the one of the excitation electrodes is closer to the hole in the vibration direction than a peripheral edge of the one of the excitation electrodes.

13. A method of measuring a characteristic of a crystal oscillator in a crystal oscillator device, the method comprising:
emitting light, by a light emitting element provided in or on a casing of a crystal oscillator, such that the light impinges on the crystal oscillator in an oscillating state and is reflected by an excitation electrode of the crystal oscillator, to generate reflected light;
receiving, by a light receiving element provided in or on the casing, the reflected light to monitor an oscillation level of the crystal oscillator based on a signal generated in the light receiving element; and
generating, by an alarm generator provided in a crystal oscillator device, an alarm based on the signal upon an index value being less than or equal to a reference value, the index value representing the oscillation level of the crystal oscillator in an oscillating state.

14. A crystal oscillator for use in a crystal oscillator device, the crystal oscillator comprising:
a casing;
a crystal piece provided in the casing;
a pair of excitation electrodes provided on the crystal piece;
a light emitting element configured to emit light that is to be reflected by one of the excitation electrodes to generate reflected light; and
a light receiving element configured to receive the reflected light,
an alarm generator is provided in a crystal oscillator device and configured to generate an alarm based on a signal upon an index value being less than or equal to a reference value, the signal being generated in the light receiving element, the index value representing an oscillation level of the crystal piece in an oscillating state.

* * * * *